US010018924B2

(12) United States Patent
Lafarre et al.

(10) Patent No.: US 10,018,924 B2
(45) Date of Patent: *Jul. 10, 2018

(54) SUBSTRATE HOLDER, LITHOGRAPHIC APPARATUS, DEVICE MANUFACTURING METHOD, AND METHOD OF MANUFACTURING A SUBSTRATE HOLDER

(71) Applicant: ASML NETHERLANDS B.V., Veldhoven (NL)

(72) Inventors: Raymond Wilhelmus Louis Lafarre, Helmond (NL); Nicolaas Ten Kate, Almkerk (NL); Nina Vladimirovna Dziomkina, Eindhoven (NL); Yogesh Pramod Karade, Eindhoven (NL); Siegfried Alexander Tromp, Papendrecht (NL); Jacobus Josephus Leijssen, Waalre (NL); Elisabeth Corinne Rodenburg, Heeze (NL); Maurice Wilhelmus Leonardus Hendricus Feijts, Beek (NL); Hendrik Huisman, Tilburg (NL)

(73) Assignee: ASML NETHERLANDS B.V., Veldhoven (NL)

( * ) Notice: Subject to any disclaimer, the term of this patent is extended or adjusted under 35 U.S.C. 154(b) by 57 days.

This patent is subject to a terminal disclaimer.

(21) Appl. No.: 15/014,829

(22) Filed: Feb. 3, 2016

(65) Prior Publication Data
US 2016/0170314 A1 Jun. 16, 2016

Related U.S. Application Data

(63) Continuation of application No. 13/398,582, filed on Feb. 16, 2012, now Pat. No. 9,256,139.
(Continued)

(51) Int. Cl.
G03B 27/58 (2006.01)
G03F 7/20 (2006.01)
(Continued)

(52) U.S. Cl.
CPC .......... *G03F 7/70716* (2013.01); *B05D 3/02* (2013.01); *G01J 5/0285* (2013.01); *G01J 5/20* (2013.01);
(Continued)

(58) Field of Classification Search
CPC ............ G03F 7/70708; G03F 7/70341; G03F 7/70716; B05D 3/02; G01J 5/0285; G01J 5/20
See application file for complete search history.

(56) References Cited

U.S. PATENT DOCUMENTS 4,480,284 A 10/1984 Tojo et al.
5,663,865 A 9/1997 Kawada et al.
(Continued)

FOREIGN PATENT DOCUMENTS

CN 101061528 10/2007
CN 101599453 12/2009
(Continued)

OTHER PUBLICATIONS

European Office Action dated May 22, 2012 in corresponding European Patent Application No. 12151380.8.
(Continued)

Primary Examiner — Deoram Persaud
(74) Attorney, Agent, or Firm — Pillsbury Winthrop Shaw Pittman, LLP

(57) ABSTRACT

A substrate holder for a lithographic apparatus has a planarization layer provided on a surface thereof. The planarization layer provides a smooth surface for the formation of a thin film stack forming an electronic component. The
(Continued)

thin film stack comprises an (optional) isolation layer, a metal layer forming an electrode, a sensor, a heater, a transistor or a logic device, and a top isolation layer.

20 Claims, 20 Drawing Sheets

Related U.S. Application Data

(60) Provisional application No. 61/576,627, filed on Dec. 16, 2011, provisional application No. 61/477,056, filed on Apr. 19, 2011, provisional application No. 61/444,483, filed on Feb. 18, 2011.

(51) Int. Cl.
    *G01J 5/20*               (2006.01)
    *G01J 5/02*               (2006.01)
    *B05D 3/02*              (2006.01)

(52) U.S. Cl.
CPC ...... *G03F 7/70341* (2013.01); *G03F 7/70708* (2013.01)

(56) References Cited

U.S. PATENT DOCUMENTS

| | | | |
|---|---|---|---|
| 6,033,475 | A | 3/2000 | Hasebe et al. |
| 6,413,701 | B1 | 7/2002 | Van Empel et al. |
| 7,110,085 | B2 | 9/2006 | Zaal et al. |
| 7,524,735 | B1 | 4/2009 | Gauri et al. |
| 7,940,511 | B2 | 5/2011 | Sijben |
| 2004/0055709 | A1 | 3/2004 | Boyd, Jr. et al. |
| 2004/0114124 | A1 | 6/2004 | Hoeks et al. |
| 2004/0160021 | A1 | 8/2004 | Tatsumi et al. |
| 2004/0207824 | A1 | 10/2004 | Lof et al. |
| 2004/0247361 | A1 | 12/2004 | Zaal et al. |
| 2005/0095776 | A1 | 5/2005 | Usuami |
| 2006/0033898 | A1 | 2/2006 | Cadee et al. |
| 2006/0038968 | A1 | 2/2006 | Kemper et al. |
| 2006/0102277 | A1 | 5/2006 | Zaal et al. |
| 2006/0285093 | A1 | 12/2006 | Hara et al. |
| 2007/0070319 | A1 | 3/2007 | Nakamura et al. |
| 2008/0212046 | A1 | 9/2008 | Riepen et al. |
| 2009/0079525 | A1 | 3/2009 | Sijben |
| 2009/0262318 | A1 | 10/2009 | Van Den Dungen et al. |
| 2009/0279060 | A1 | 11/2009 | Direcks et al. |
| 2009/0279062 | A1 | 11/2009 | Direcks et al. |
| 2010/0193501 | A1 | 8/2010 | Zucker et al. |
| 2011/0062604 | A1 | 3/2011 | Yess et al. |
| 2011/0222032 | A1 | 9/2011 | Ten Kate et al. |
| 2011/0222033 | A1 | 9/2011 | Ten Kate et al. |
| 2011/0292561 | A1 | 12/2011 | Kamimura et al. |
| 2012/0147353 | A1 | 6/2012 | Lafarre et al. |
| 2012/0274920 | A1 | 11/2012 | Bex et al. |
| 2013/0094009 | A1 | 4/2013 | Lafarre et al. |
| 2013/0189802 | A1 | 7/2013 | Tromp et al. |

FOREIGN PATENT DOCUMENTS

| | | |
|---|---|---|
| CN | 101803001 | 8/2010 |
| JP | H03-187240 | 8/1991 |
| JP | H05-47909 | 2/1993 |
| JP | H05-205997 | 8/1993 |
| JP | 09-270327 | 10/1997 |
| JP | 09-270445 | 10/1997 |
| JP | 2001-028333 | 1/2001 |
| JP | 2004-531067 | 10/2004 |
| JP | 2007-201068 | 8/2007 |
| JP | 2010-161319 | 7/2010 |
| JP | 2010-541196 | 12/2010 |
| JP | 2012-129524 | 7/2012 |
| JP | 2012-235095 | 11/2012 |
| WO | 99/49504 | 9/1999 |
| WO | 2010/095540 | 8/2010 |
| WO | 2012/00529 | 1/2012 |
| WO | 2013/113568 | 8/2013 |
| WO | 2013/113569 | 8/2013 |
| WO | 2013/156236 | 10/2013 |

OTHER PUBLICATIONS

Korean Office Action dated Jun. 14, 2013 in corresponding Korean Patent Application No. 10-2012-0016588.
European Examination Report dated Feb. 7, 2014 in corresponding European Patent Application No. 12 151 380.8.
W. McCormick et al., "Polymeric Underlayer for Thin Films on Ferrite Substrates," IBM Technical Disclosure Bulletin, vol. 19, No. 8, p. 2926 (Jan. 1977).
English Machine Translation of JP 2010-161319, translated by Thomson Scientific.
Office Action issued in corresponding Chinese Patent Application No. 201610252175.0, dated Apr. 28, 2017.

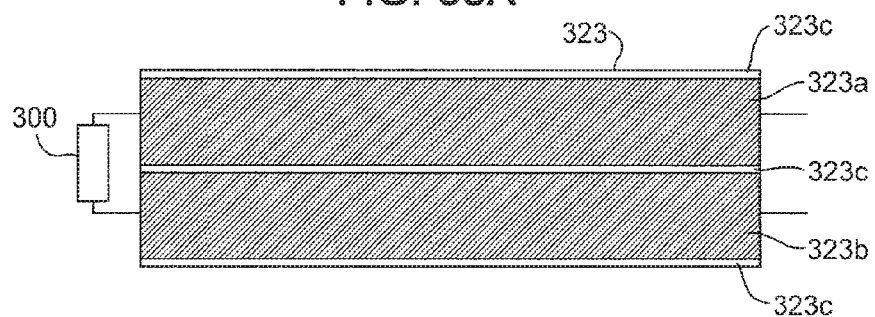
FIG. 38A
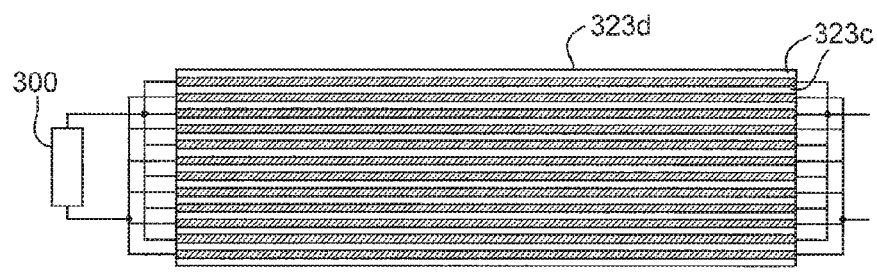
FIG. 38B
FIG. 39A
FIG. 39B

SUBSTRATE HOLDER, LITHOGRAPHIC APPARATUS, DEVICE MANUFACTURING METHOD, AND METHOD OF MANUFACTURING A SUBSTRATE HOLDER

This application is a continuation of co-pending U.S. patent application Ser. No. 13/398,582, filed Feb. 16, 2012, which claims priority and benefit under 35 U.S.C. § 119(e) to U.S. Provisional Patent Application Ser. No. 61/576,627, filed on Dec. 16, 2011, to U.S. Provisional Patent Application Ser. No. 61/477,056, filed on Apr. 19, 2011, and to U.S. Provisional Patent Application Ser. No. 61/444,483, filed on Feb. 18, 2011. The contents of those applications are incorporated herein in their entirety by reference.

FIELD

The present invention relates to a substrate holder, a lithographic apparatus, a device manufacturing method, and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burls or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. The purpose of this is to help prevent a particle (i.e. a contaminating particle such as a dust particle) which might be present on either the substrate table or substrate holder from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping may therefore be used. In electrostatic clamping, a potential difference is established between the substrate, or an electrode plated on its lower surface, and an electrode provided on the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate is separately clamped to the substrate holder.

Temperature control over the substrate surface is significant, in particular in immersion systems which are sensitive to temperature variations due to liquid (e.g. water) evaporation effects. Evaporation of liquid from a substrate may apply a heat load to the substrate, leading to the temperature variations. The temperature variations lead to thermal stress in the substrate which eventually may contribute to overlay error. To achieve improved accuracy in temperature control, real time local measurement of the temperature combined with active heating is desired. Such a measurement and heating system is integrated into the system, i.e. in the substrate holder (i.e. the object that directly supports a substrate) and/or substrate table (mirror block or stage, i.e. the object such as a table that supports the substrate holder and provides an upper surface surrounding the substrate holder). A thin film stack can be used to make a structure that can both measure and heat. Such a structure offers the opportunity for integration into the substrate table or both.

It is desirable, for example, to provide a substrate table or substrate holder on which one or more electronic components, such as one or more thin-film components, are formed.

According to an aspect of the invention, there is provided a substrate holder for use in a lithographic apparatus, the substrate holder comprising: a main body having a surface; a plurality of burls projecting from the surface and having end surfaces to support a substrate; a planarization layer provided on at least part of the main body surface; and a thin film stack provided on the planarization layer and forming an electric component.

According to an aspect of the invention, there is provided a lithographic apparatus, comprising: a support structure configured to support a patterning device; a projection system arranged to project a beam patterned by the patterning device onto a substrate; and a substrate holder arranged to hold the substrate, the substrate holder comprising: a main body having a surface, a plurality of burls projecting from the surface and having end surfaces to support a substrate, a planarization layer provided on at least part of the main body surface, and a thin film stack provided on the planarization layer and forming an electric component.

According to an aspect of the invention, there is provided a device manufacturing method using a lithographic apparatus, the method comprising: projecting a beam patterned by a patterning device onto a substrate while holding the substrate in a substrate holder, wherein the substrate holder comprises: a main body having a surface; a plurality of burls projecting from the surface and having end surfaces to support a substrate; a planarization layer provided on at least part of the main body surface; and a thin film stack provided on the planarization layer and forming an electric component.

According to an aspect of the invention, there is provided a substrate holder for use in a lithographic apparatus, the substrate holder comprising: a main body having a surface; a plurality of burls projecting from the surface and having end surfaces to support a substrate; and a planarization layer provided on at least part of the main body surface, the planarization layer comprises a first sub-layer and a second sub-layer, the second sub-layer having a different composition than the first sub-layer.

According to an aspect of the invention, there is provided a method of manufacturing a substrate holder for use in a lithographic apparatus, the method comprising: providing a main body having a surface and a plurality of burls projecting from the surface and having end surfaces to support a substrate; and forming a planarization layer on at least part of the main body surface, wherein forming the planarization layer comprises forming a first sub-layer and a second sub-layer on the first sub-layer, the second sub-layer having a different composition than the first sub-layer.

According to an aspect of the invention, there is provided a method of manufacturing a substrate holder for use in a lithographic apparatus, the method comprising: providing a main body having a surface and a plurality of burls projecting from the surface and having end surfaces to support a substrate; and forming a planarization layer on at least part of the main body surface, wherein forming planarization layer comprises forming a first sub-layer, baking the first sub-layer to cure it, and forming a second sub-layer on the first sub-layer.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 38A and 38B depict connectors usable in an embodiment of the invention;

FIGS. 39A and 39B depict differences in effective areas of the connectors of FIGS. 38A and 38B;

DETAILED DESCRIPTION

Figure 1:
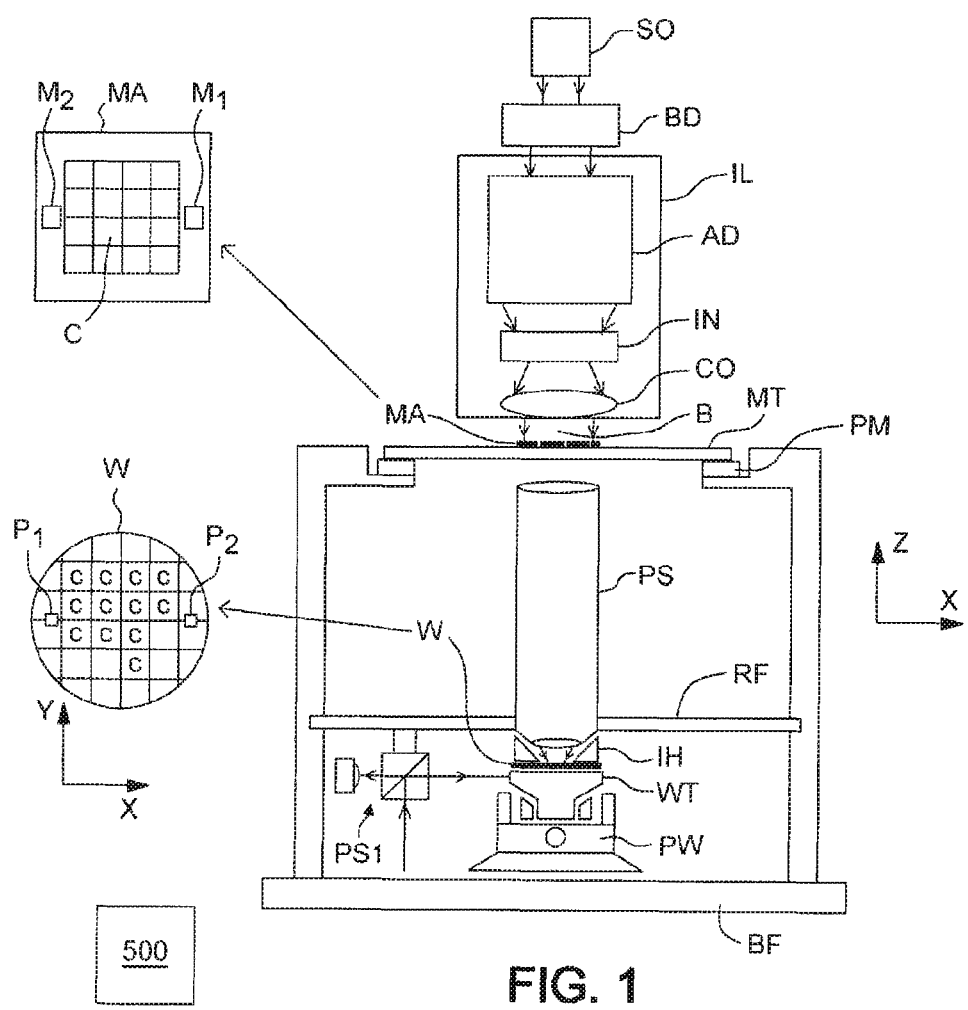
FIG. 1 depicts a lithographic apparatus according to an embodiment of the invention.
Figure 44:
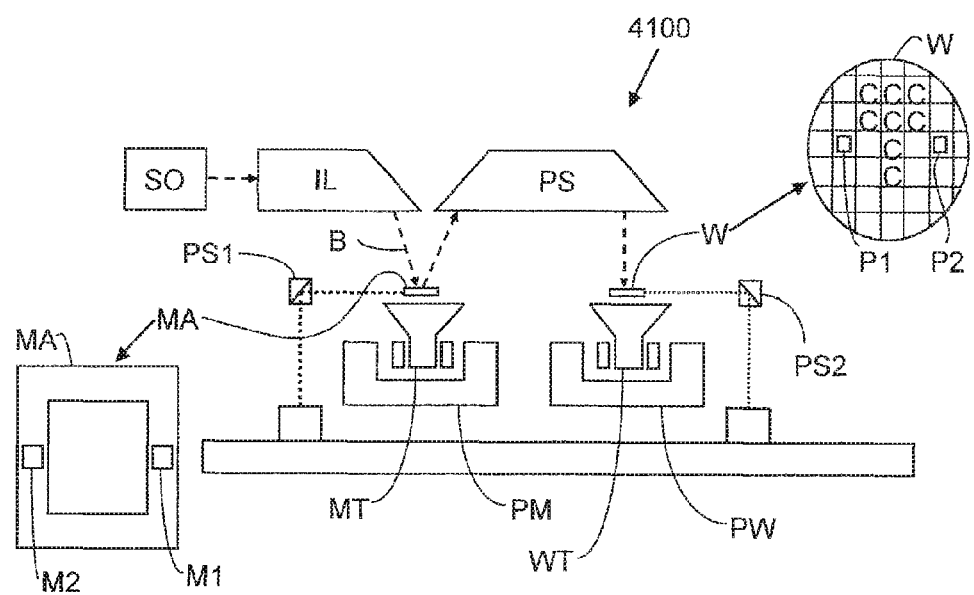
FIG. 44 depicts a lithographic apparatus according to an embodiment of the invention.

FIGS. 1 and 44 schematically depicts a lithographic apparatus according to an embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters. A substrate holder as described herein can be used to hold the substrate W on the substrate table WT; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein, like the term "illumination system", should be broadly interpreted as encompassing any type of projection system, including refractive, reflective, catadioptric, magnetic, electromagnetic and electrostatic optical systems or other types of optical components, or any combination thereof, as appropriate for the exposure radiation being used, or for other factors such as the use of an immersion liquid or the use of a vacuum. Any use of the term "projection lens" herein may be considered as synonymous with the more general term "projection system". The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As depicted in FIG. 1, the apparatus is of a transmissive type (e.g. employing a transmissive mask). Alternatively, as depicted in FIG. 44, the apparatus may be of a reflective type (e.g. employing a programmable mirror array of a type as referred to above, or employing a reflective mask).

The lithographic apparatus may be of a type having two or more tables (or stages or supports) which may be referred to as dual stage, e.g., two or more substrate tables or a combination of one or more substrate tables and one or more sensor or measurement tables. In such "multiple stage" machines the additional tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, sensor and/or measurement tables.

Referring to FIGS. 1 and 44, the illuminator IL receives a radiation beam from a radiation source SO in FIG. 1 or a source collector apparatus SO in FIG. 44. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 44, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation. In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge produced plasma EUV generator, often termed as a DPP source.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN, a condenser CO, a facetted field mirror device and/or a pupil mirror device. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor PS1 (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 45:
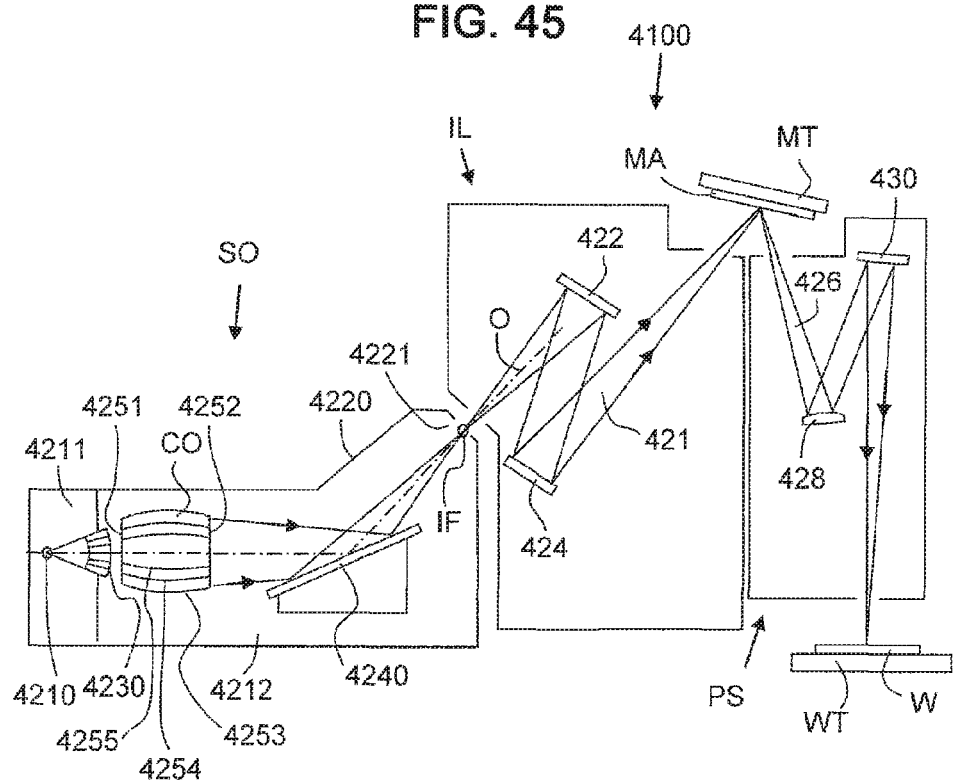
FIG. 45 is a more detailed view of the apparatus of FIG. 44.

FIG. 45 shows an EUV radiation apparatus 4100 in more detail, including the source collector apparatus SO, the illumination system IL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the very hot plasma 4210 is created to emit radiation in the EUV range of the electromagnetic spectrum. The very hot plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 4210 is passed from a source chamber 4211 into a collector chamber 4212 via an optional gas barrier or contaminant trap 4230 (in some cases also referred to as contaminant barrier or foil trap) which is positioned in or behind an opening in source chamber 4211. The contaminant trap 4230 may include a channel structure. Contaminant trap 4230 may include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected off a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be 1-6 additional reflective elements present in the projection system PS than shown in FIG. 45.

Collector optic CO, as illustrated in FIG. 45, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 46:
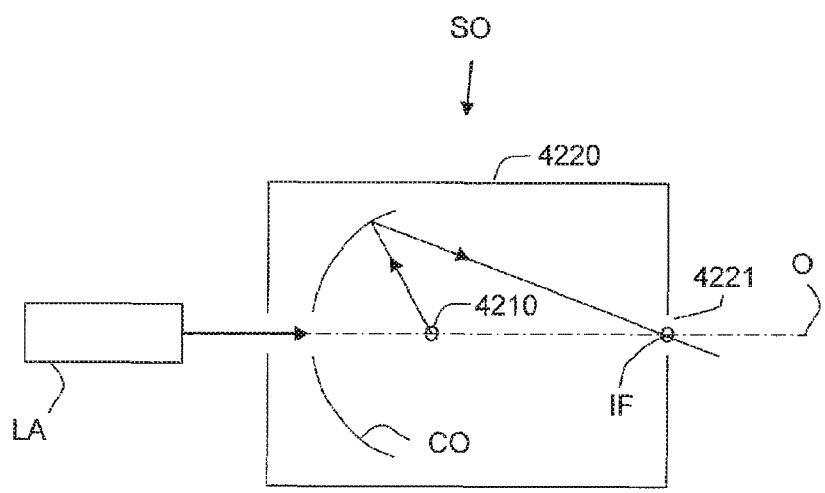
FIG. 46 is a more detailed view of the source collector of the apparatus of FIGS. 44 and 45.

Alternatively, the source collector apparatus SO may be part of an LPP radiation system as shown in FIG. 46. A laser LA is arranged to deposit laser energy into a fuel, such as xenon (Xe), tin (Sn) or lithium (Li), creating the highly ionized plasma 4210 with electron temperatures of several ten's of eV. The energetic radiation generated during de-excitation and recombination of these ions is emitted from the plasma, collected by a near normal incidence collector optic CO and focused onto the opening 4221 in the enclosing structure 4220.

In many lithographic apparatus a fluid, in particular a liquid for example an immersion lithographic apparatus, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Anther arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Four different types of localized liquid supply systems are illustrated in FIGS. 2-5. Any of the liquid supply devices of FIGS. 2-5 may be used in an unconfined system; however, sealing features are not present, are not activated, are not as efficient as normal or are otherwise ineffective to seal liquid to only the localized area.

Figure 2:
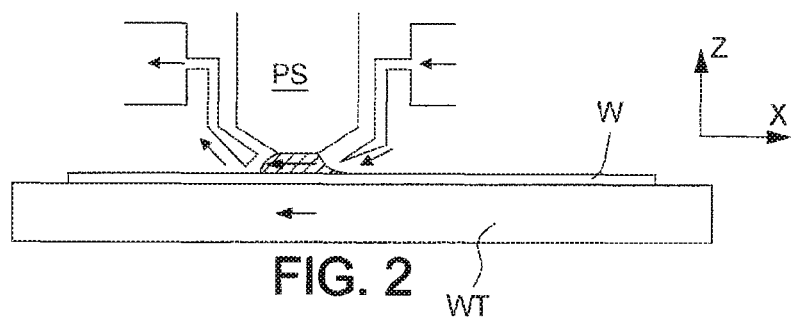
FIGS. 2 and 3 depict a liquid supply system for use in a lithographic projection apparatus.
Figure 3:
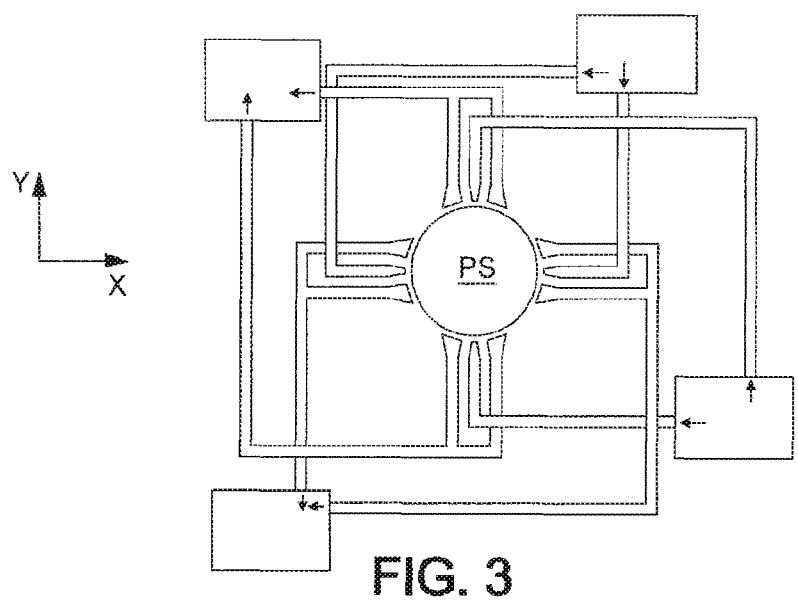

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
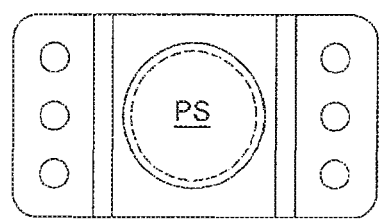
FIG. 4 depicts a further liquid supply system for use in a lithographic projection apparatus.
Figure 4:
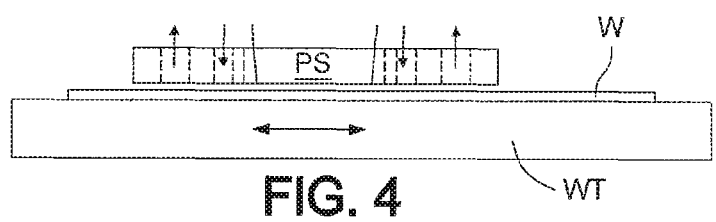

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Figure 5:
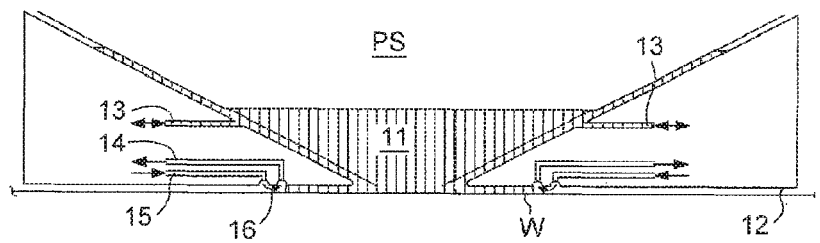
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication nos. US 2008-0212046, US 2009-0279060, and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
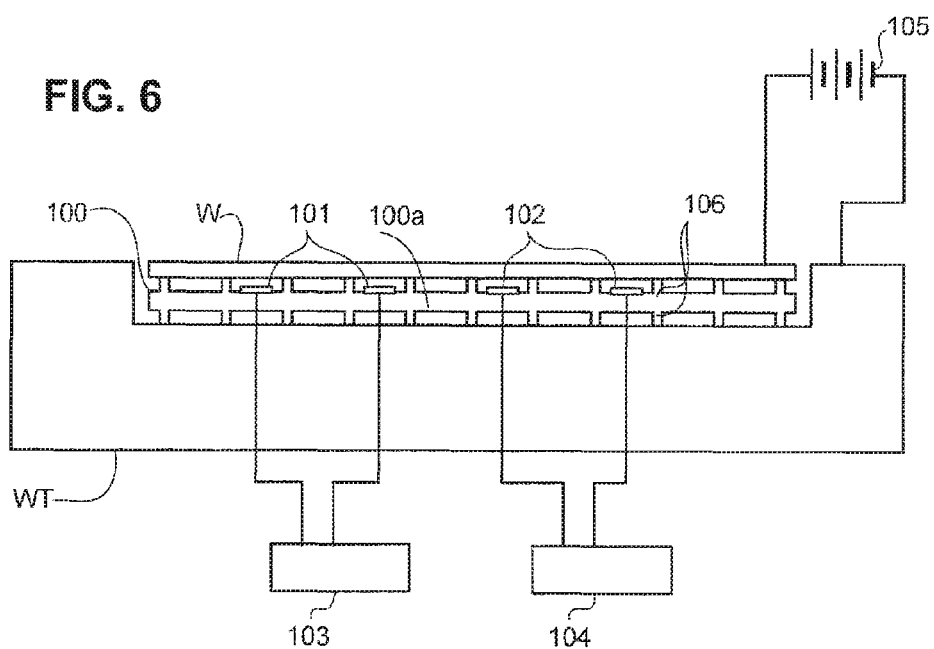
FIG. 6 depicts in cross-section a substrate table and a substrate holder according to an embodiment of the invention.

FIG. 6 depicts a substrate holder 100 according to an embodiment of the invention. It may be held within a recess in substrate table WT and supports substrate W. The main body of the substrate holder 100*a*, in an embodiment, is substantially flat and corresponds in shape and size to the substrate W, e.g., a flat plate, for example a disc. At least on a top side, in an embodiment on both sides, the substrate holder has projections 106, commonly referred to as burls. In an embodiment, the substrate holder is an integral part of the substrate table and does not have burls on the lower surface. The burls are not shown to scale in FIG. 6. In a practical embodiment, there can be many hundreds of burls distributed across a substrate holder of diameter, e.g., 200 mm, 300 mm or 450 mm. The tips of the burls have a small area, e.g. less than 1 mm$^2$, so that the total area of all of the burls on one side of the substrate holder 100 is less than about 10% of the total area of the total surface area of the substrate holder. Because of the burl arrangement on the support, there is a high probability that any particle that might lie on the surface of the substrate, substrate holder or substrate table will fall between burls and will not therefore result in a deformation of the substrate or substrate holder. The burl arrangement, which may form a pattern, can be regular or can vary as desired to provide appropriate distribution of force on the substrate and substrate table. The burls can have any shape in plan but are commonly circular in plan. The burls can have the same shape and dimensions throughout their height but are commonly tapered. The burls can project a distance of from about 1 μm to about 5 mm, desirably from about 5 μm to about 250 μm, from the rest of the surface of the main body of the substrate holder 100*a*. The thickness of the main body 100*a* of the substrate holder 100 can be in the range of about 1 mm to about 50 mm, desirably in the range of about 5 mm to 20 mm, typically 10 mm.

In an embodiment of the invention, the substrate holder 100 is made of rigid material. Desirably the material has a high thermal conductivity or a low coefficient of thermal expansion. A suitable material includes SiC (silicon carbide), SiSiC (siliconised silicon carbide), $Si_3N_4$ (silicon nitrite), quartz, and/or various other ceramic and glass-ceramics, such as Zerodur™ glass ceramic. The substrate holder 100 can be manufactured by selectively removing material from a solid disc of the relevant material so as to leave the projecting burls. A suitable technique to remove material includes electrical discharge machining (EDM), etching, machining and/or laser ablation. Some of these techniques leave a rough surface, e.g. having a roughness value Ra of the order of several microns. The minimum roughness achievable with these removal techniques may derive from the material properties and burl manufacturing process. For example, in the case of a two-phase material such as SiSiC, the minimum roughness achievable is determined by the grain size of the two-phase material. The substrate holder can also be manufactured by growing burls through a mask. The burls are of the same material as the base and can be grown by a physical vapor deposition process or sputtering.

Such residual roughness causes difficulty in forming one or more electrical components, such as one or more thin film components, on the surface of the substrate and unreliability in such components. These problems may arise because the roughness causes gaps and cracks in thin layers coated or grown on the substrate holder to form an electronic component. A thin film component may have a layer thickness in the range of from about 2 nm to about 100 μm and may be formed by a process including chemical vapor deposition, physical vapor deposition (e.g. sputtering), dip coating, spin coating and/or spray coating. In an embodiment, a component formed on the substrate holder comprises a thin film stack, i.e. including a plurality of thin film layers. Such components are described further below.

An electronic component to be formed on the substrate table can include, for example, an electrode, a resistive heater and/or a sensor, such as (in a non-limiting list) a strain sensor, a magnetic sensor, a pressure sensor, a capacitive sensor or a temperature sensor. A heater and sensor, for example when included in a electrical system or circuit, can be used to locally control and/or monitor the temperature of the substrate holder and/or substrate so as to reduce undesired or induced desired temperature variation and stress in the substrate holder or substrate. Desirably, the heater and sensor are located on, around and/or over the same region as each other. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g., water) on the substrate may cause localized cooling, may apply a heat load to the surface on which the liquid is located and hence shrinkage of the substrate. Conversely, the energy delivered to the substrate by the projection beam during exposure can cause significant heating, apply a heat load to the substrate and therefore expansion of the substrate.

In an embodiment, the component to be formed is an electrode for an electrostatic clamp. In electrostatic clamping, a potential difference is established between the substrate, or an electrode plated on its lower surface, and an electrode provided on the substrate table and/or substrate holder. The two electrodes behave as a large capacitor and substantial clamping forces can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate separately clamped to the substrate holder.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. Voltage source 105 generates a potential difference e.g. of the order of 10 to 5,000 volts, between the substrate W and the substrate holder 100 and between the substrate holder 100 and the substrate table WT so that an electrostatic force clamps the substrate W, substrate holder 100 and substrate table WT together. In an embodiment, the potential difference is provided between an electrode on the lower surface of the substrate W and an electrode on the bottom of the recess in the substrate table WT. Arrangements using one or more heaters and temperature sensors to locally control the temperature of a substrate are described in co-pending U.S. patent application publication nos. US 2011/0222033 and US 2011/0222032, which documents are incorporated herein by reference in their entirety. The arrangements described therein can be modified to make use of a resistive heater and temperature sensor as described herein.

As shown in FIG. 6, electrical connections exist to connect the electrode or electrical device on the substrate holder to the voltage source 105. If the electrical device is an electrostatic clamp, the electrode on the substrate has an electrical connection to the voltage source 105. The electrical devices may be on a top surface of the substrate support. At least part of the electrical connection may pass through the body of the substrate support as described in U.S. patent application no. U.S. 61/555,359 filed on 3 Nov. 2011 which is hereby incorporated by reference in its entirety.

Figure 7:
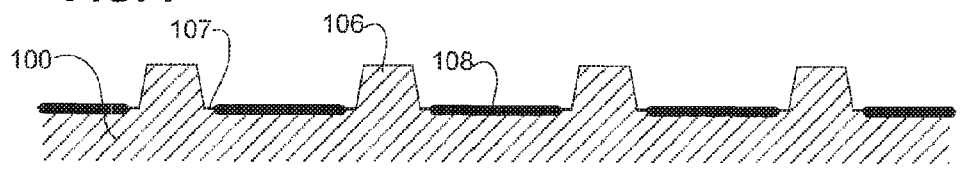
FIG. 7 is an enlarged view of a part of the substrate holder of FIG. 6.
Figure 8:
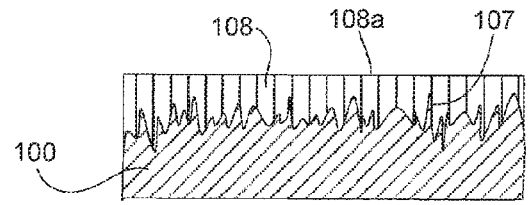
FIG. 8 is a further enlarged view of a part of the substrate holder of FIGS. 6 and 7.

FIG. 7 is an enlargement of part of the substrate holder 100 of FIG. 6 showing the upper surface 107 and some burls 106 in cross-section. In an embodiment of the invention, a planarization layer 108 is provided on the upper surface 107 in at least some areas between the burls 106. In an embodiment, the planarization layer can be provided only where an electronic component is to be formed or across substantially the entire upper surface of the substrate holder 100. FIG. 8 shows a further enlargement of the planarization layer 108. As can be seen, the planarization layer fills in roughness of the upper surface 107 and provides an upper surface 108a that is substantially smoother than the surface 107. In an embodiment of the invention the roughness Ra of the surface 108a is less than about 1.5 µm, desirably less than about 1 µm, or desirably less than about 0.5 µm. In an embodiment, a roughness Ra of surface 108a of less than 0.2 µm is achieved by polishing the planarization layer 108 in between the burls after curing.

In an embodiment, the planarization layer 108 is formed by applying a plurality, e.g. two, layers of coating material or precursor material. In an embodiment, the planarization layer 108 may be formed by applying a single layer of coating material or precursor material. Depending upon the material of the planarization layer it can be possible to determine from inspection of the formed coating that it has been applied by forming multiple sub-layers. In an embodiment, the multiple sub-layers of the planarization layer 108 are formed of the same material. In an embodiment, the multiple sub-layers of the planarization layer 108 are formed of different materials. Suitable materials are discussed below.

In an embodiment, the planarization layer 108 is formed of a silicon oxide or silicon nitride-based compound with a functional group attached to each Si atom. The functional groups can be selected from the group consisting of hydrogen, methyl, fluoro, vinyl and the like. In an embodiment, the planarization layer 108 is formed of $Si(CH_3)_2O_x$. In an embodiment the planarization layer is formed of SiOx, e.g. $SiO_2$. In an embodiment the planarization layer is formed of benzocyclobutene (BCB). In an embodiment the planarization layer is formed of a polyimide coating material. A method of applying such a material is described in U.S. Pat. No. 7,524,735, which document is incorporated herein in its entirety by reference. In an embodiment the planarization layer is formed of polymer chains consisting of $Si(CH_3)_2N$ and $Si(CH_3)_2O$ backbones.

The planarization layer may have a thickness in the range of from about 0.2 µm to about 200 µm, desirably from about 2 µm to about 30 µm or desirably from about 10 µm to about 20 µm. The planarization layer is desirably sufficiently thick to fill-in most or all of the roughness of the surface of the substrate holder. If the planarization layer is too thick, it is more likely to crack during curing. Applying the planarization layer in a plurality of separate coats, as described below, can reduce the chance of such cracking and reduce the surface roughness of the final layer.

Figure 16:
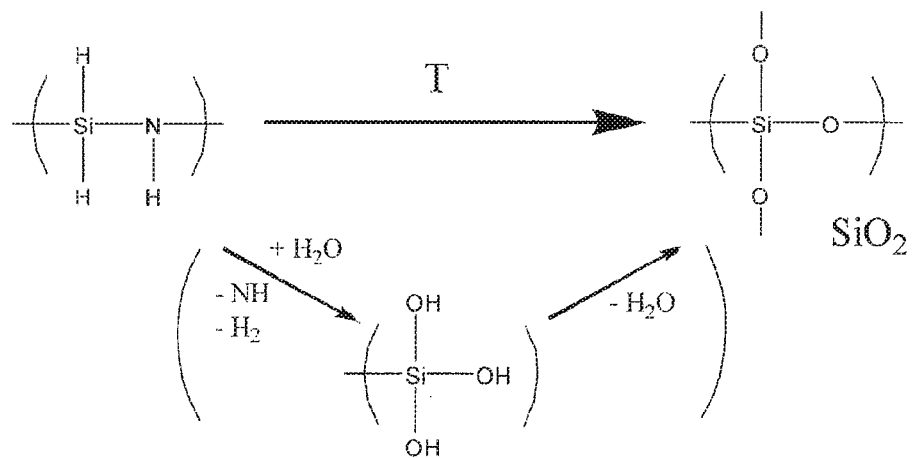
FIGS. 16 to 19 depict chemical reactions in formation of a planarization layer in an embodiment of the invention.
Figure 17:
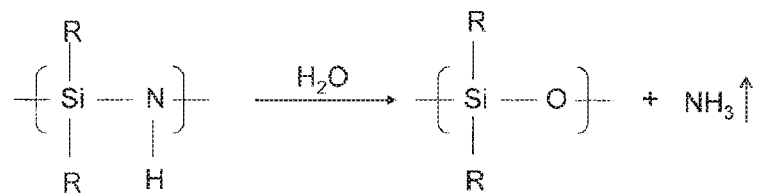
Figure 18:
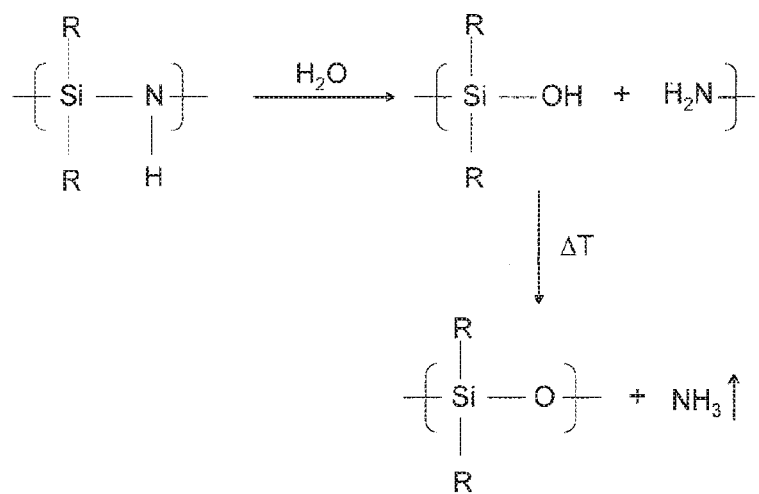
Figure 19:
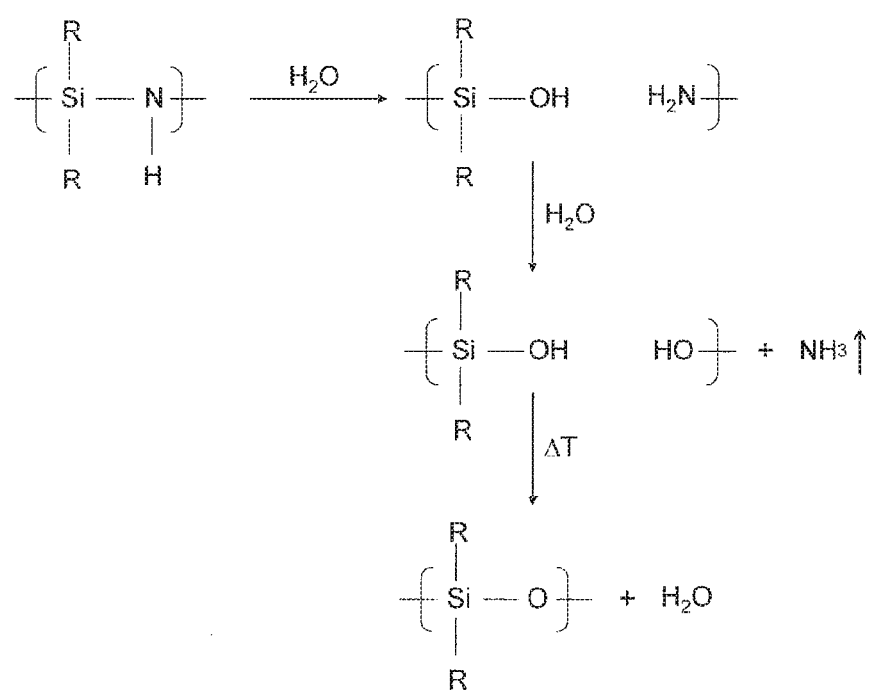

In an embodiment, the planarization layer 108 is applied by coating the substrate holder 100 with a polysilazane solution which is then cured to form the silicon-based planarization layer. The reaction involved is shown in FIG. 16. In an embodiment, the polysilazane solution is applied by a spray technique. Additionally or alternatively, other techniques such as deposition and spin coating can be used. FIGS. 17 to 19 depict other reactions that can be used to form a planarization layer in an embodiment of the invention. FIG. 17 depicts a reaction that proceeds via an aqueous medium alone. FIG. 18 depicts a reaction that proceeds in an aqueous medium in the presence of heat. FIG. 19 depicts another reaction that proceeds in an aqueous medium in the presence of heat. In each of FIGS. 17 to 19, R depicts a functional group selected from the group consisting of hydrogen, methyl, fluoro. In an embodiment, the polymer layer includes a mixture of —Si—N— backbones from the reactant polysilazane and —Si—O— backbones from the reaction products.

The planarization layer provides a surface that is sufficiently smooth for reliable formation of a metal or other layer to form a thin film component. In particular, glass bonding steps that may be required with some materials used to form a substrate holder may be unnecessary.

Figure 9:
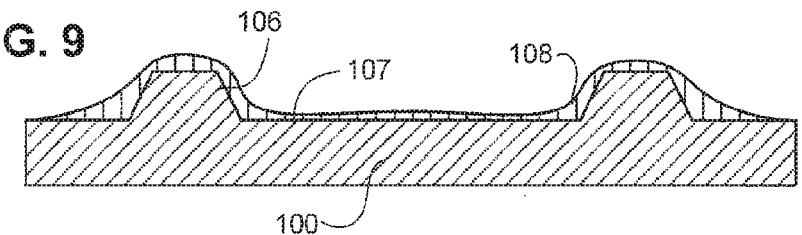
FIGS. 9 and 10 depict steps in a method of manufacturing a substrate holder according to an embodiment of the invention.
Figure 10:
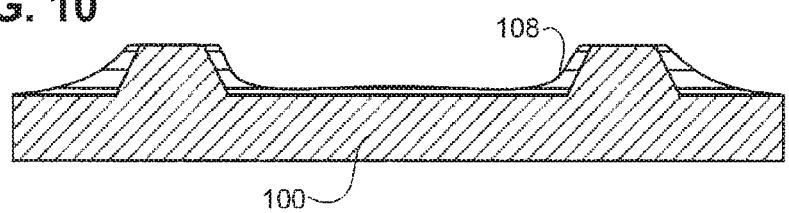
Figure 11:
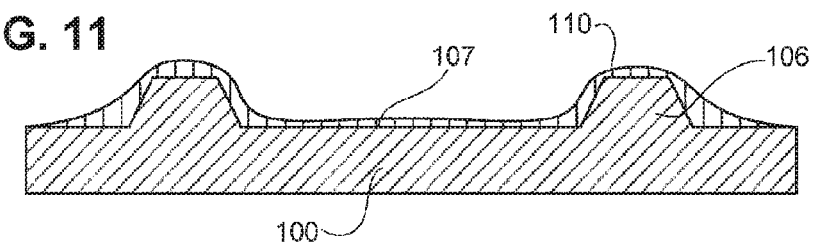
FIGS. 11 to 14 depict steps in a method of manufacturing a substrate holder according to an embodiment of the invention.

FIGS. 9 and 10 illustrate steps in an embodiment of a method of applying the planarization layer 108. As shown in FIG. 9, the polysilazane solution is sprayed across the upper surface 107 of the substrate holder 100 and cured to form a continuous layer. This layer initially covers the burls 106 as well as the spaces between them. In a second step, the result of which is shown in FIG. 10, the planarization material is removed from the top of the burls 106. This removal step can be performed using a known technique, such as machining (lapping or polishing), a chemical process (such as etching) with a laser, and/or chemical mechanical polishing (CMP). This method has an advantage that it is quick, involving only two steps.

Figure 12:
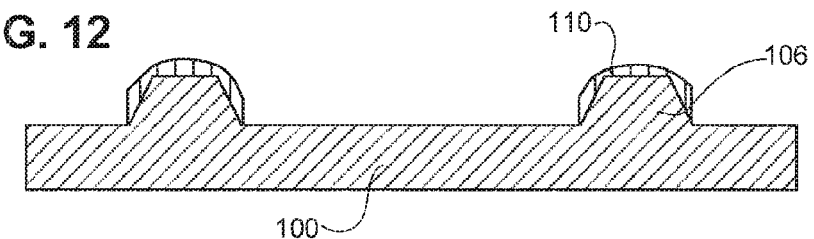
Figure 13:
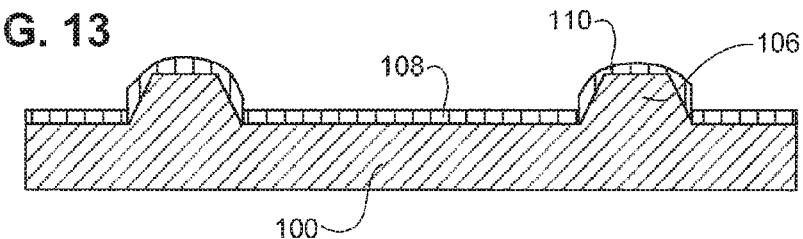
Figure 14:
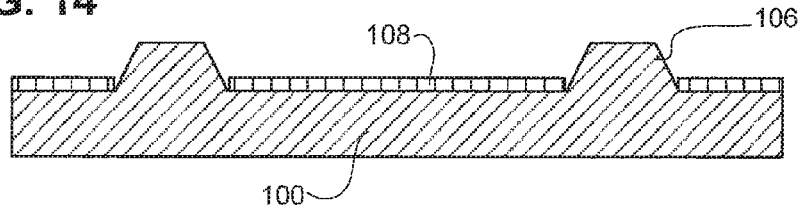

FIGS. 11 to 14 illustrate steps in a further embodiment of a method applying the planarization layer 108. In this method, a photoresist 110 is applied to the whole of the upper surface 107 of the substrate holder 100. The photoresist is then selectively exposed and the exposed or unexposed photoresist, depending on whether the photoresist is positive or negative, is removed, so that photoresist 110 remains only covering the burls 106 as shown in FIG. 12. Planarization material 108 is then applied, as shown in FIG. 13. Finally, the remaining photoresist is removed to leave planarization material 108 only in the spaces between the burls 106.

Figure 15:
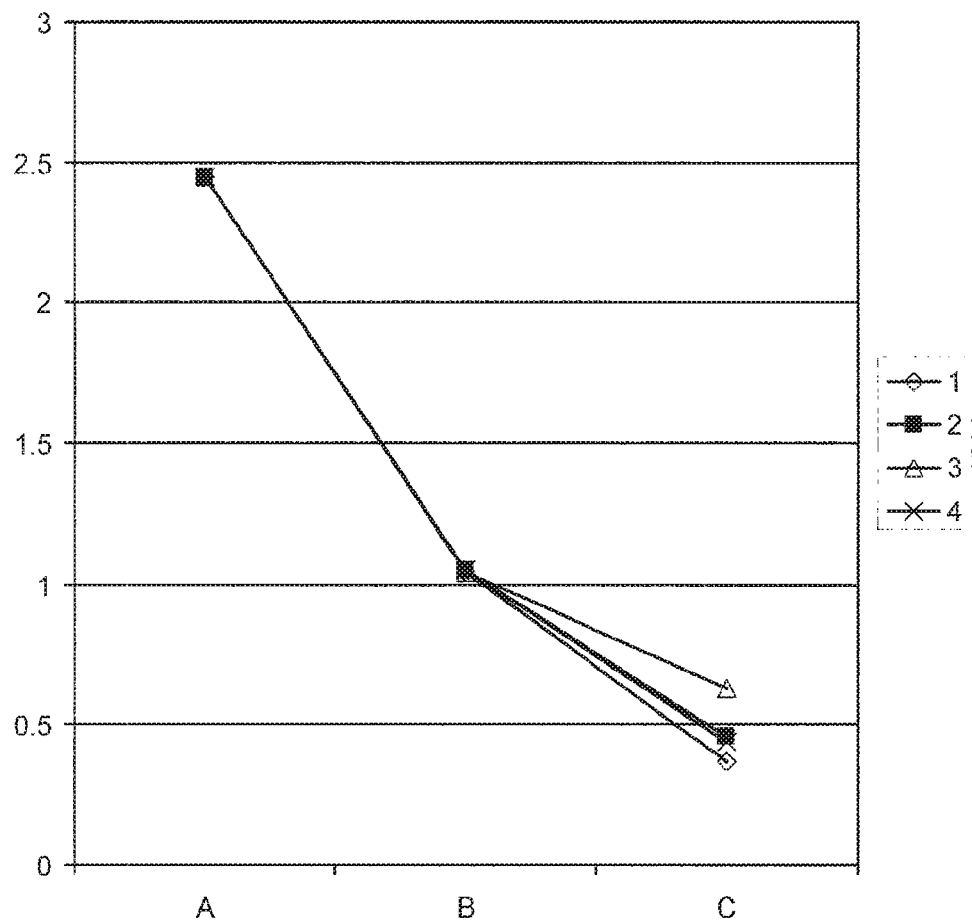
FIG. 15 is a graph depicting surface roughness of some examples of an embodiment of the invention.

In both of the above methods, the planarization layer 108 can be applied in multiple coating steps in order to reduce the surface roughness. FIG. 15 is a graph showing roughness values Ra in μm for planarization layers of four samples, numbered 1 to 4, of substrate holders according to an embodiment of the present invention. The substrate holder was of a SiSiC material and as shown at A in FIG. 15 had a surface roughness Ra prior to any coating or other treatment of 2.45 μm. The samples were then spray coated with a polysilazane solution (CAG 37 obtained from Clariant Advanced Materials GmbH) and allowed to dry. In the case of samples 1 and 3, the amount of solution applied was sufficient to achieve a layer thickness of 2.4 μm. In the case of samples 2 and 4 a greater amount was applied to achieve a layer thickness of 4 μm. After curing, the surface roughness Ra of samples 1 and 3 was measured at 1.04 μm and that of samples 2 and 4 as 1.05 μm, as shown at B in FIG. 15.

Before a second layer was applied, the first layers were hydrophillised by exposing them to air plasma for approximately 1 minute. This step can be omitted if only a single layer is to be applied or if the material applied is not hydrophobic. The amounts of material applied to form the second layer were varied. Samples 1 and 2 had an amount of solution applied to form a coating of 2.4 μm while samples 3 and 4 had an amount of solution applied to form a coating of thickness 4 μm. After curing of the second coating, the roughness Ra values of samples 1 to 4 were measured respectively at 0.37 μm, 0.46 μm, 0.63 μm and 0.44 μm, as shown at C in FIG. 15. From these results, an improved surface roughness may be achieved by a two-step coating technique and it may be desirable that the thickness of a second coating layer is not greater than the thickness of a first applied coating layer.

Layer thicknesses and measured roughness are shown in Table 1:

TABLE 1

| Sample: | 1 | 2 | 3 | 4 |
|---|---|---|---|---|
| 1st Coating Thickness (μm) | 2.4 | 4 | 2.4 | 4 |
| 2nd Coating Thickness (μm) | 2.4 | 2.4 | 4 | 4 |
| Uncoated Roughness Ra (μm) | 2.45 | 2.45 | 2.45 | 2.45 |
| Roughness Ra (μm) after one coat | 1.04 | 1.05 | 1.04 | 1.05 |
| Roughness Ra (μm) after two coats | 0.37 | 0.46 | 0.63 | 0.44 |

Roughness values given above where obtained using a Taylor Hobson stylus profiler having a diamond tip of radius 2 μm, which is scanned over the layer to measure its profile and Ra is estimated from the contour map. Other equivalent instruments and methods can be used instead.

Figure 20:
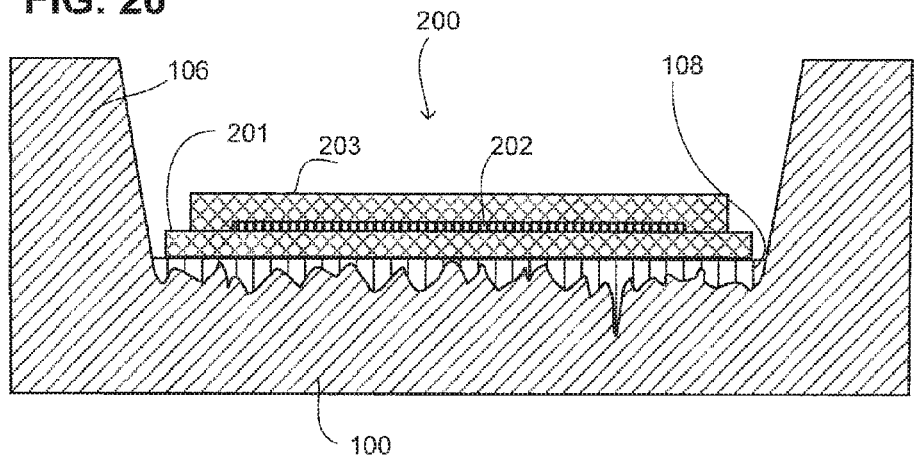
FIG. 20 depicts in cross-section a substrate holder according to an embodiment of the invention.

As shown in FIG. 20, an embodiment of the invention involves deposition of different layers forming a thin-film stack 200 on a (SiSiC) surface of a substrate holder 100 between the burls 106 in the following general order viz. 1) planarization layer 108, 2) isolation layer 201 (if necessary), 3) metal lines 202 and 4) top isolation layer 203. In an embodiment of the present invention the thin layer stack can be formed on a substrate holder formed of other materials (as described above) or a substrate table formed of similar materials.

The planarization layer 108 is in general as described above but other forms of layer and methods of forming the layer can be used. The planarization layer in an embodiment has a thickness greater than 10 μm. A SiSiC substrate table has rough surface (with high Ra of approximately 4 μm and peak to valleys of approximately 43 μm) between the burls. Such roughness does not allow patterning of thin metal electrode lines (e.g., thickness of 20 to 200 nm). To reduce the roughness, polymer dissolved in a suitable solvent is sprayed on the rough SiSiC surface. The liquid layer fills up the valleys present on the EDM finished rough SiSiC between the burls. The liquid is cured to evaporate the solvent and form a smooth polymer layer or planarization layer. Metal electrode lines can be patterned on such a planarized surface. If the planarization layer is sufficiently thick and covers all the sharp SiSiC peaks, it may also provide electrical isolation between the SiSiC and the patterned metal electrode lines. The planarization layer can be sprayed all at once or built in a stack by repeating the cycle of spraying a thin layer, curing and spraying a next layer and so on until the desired layer thickness is achieved. A planarization layer may consist of sprayed layers of BCB (40% bis-benzocyclobutene dissolved in 1,3,5-trimethyl benzene) alone or in combination with sprayed layers of NN 120 (20% perhydropolysilazane in di-butyl ether). In an embodiment, a SiSiC surface has an about 10 micron BCB layer applied which provides an average Ra of about 0.8 microns and average peak-to-valleys of about 4.1 microns. In an embodiment, a SiSiC surface has an about 20 micron BCB layer applied which provides a average Ra of about 1.5 microns and average peak-to-valleys of about 8.5 microns.

The planarization layer is suitable for facilitating the metal electrode patterning, but may not cover all the SiSiC peaks. A thin layer (isolation layer) of PE CVD (Plasma Enhanced Chemical Vapor Deposition) $SiO_x$ can be deposited on top of the planarization layer to provide electrical isolation between the SiSiC peaks and metal electrode lines if necessary. If the electrical isolation provided by isolation layer is not sufficient, a planarization layer may be sandwiched between two isolation layers and the stack follows the sequence of first isolation layer (PE CVD $SiO_x$), then planarization layer and second isolation layer (PE CVD $SiO_x$). The isolation layer 201 desirably has a thickness greater than 0.1 μm. Desirably it has a thickness less than 10 μm. In an embodiment the isolation layer has a thickness of 5 μm.

On top of the isolation layer, metal conduction paths, e.g. lines 202 are deposited by photolithography or metal deposition and etching through a hard mask. Metal lines 202 desirably have a width greater than 20 μm. The maximum width of the metal lines is determined by their function and available space; it can be several 10s of millimeters. Other methods of forming the metal lines are usable. In the case of a heater and/or sensor, wide metal lines (e.g. about 1500 μm) can be used as heating elements and narrow metal lines (e.g. about 100 μm) can be used as sensor elements. For an electrostatic clamp, two halves of continuous metal film (but isolated from the burl tops) separated by approximately 500 μm from each other can be deposited to form positive and negative elements of the electrostatic clamp. Metal lines 202 desirably have a layer thickness greater than about 20 nm, desirably greater than about 40 nm. Metal lines 202 desirably have a layer thickness less than or equal to about 1 μm, desirably less than about 500 nm, desirably less than about 200 nm.

For heater and/or sensor development, patterned metal lines may consist of multiple metal layers of, for example, titanium (Ti) and platinum (Pt), Ti—Pt. In an embodiment, the line has one or more layers of titanium with a cumulative thickness of 10 nm for improved adhesion of approximately 250 nm thick platinum present in one or more thin film layers. Each metal line may have varying width. Patterning of the metals, e.g. Ti/Pt, may be achieved using a combination of one or more photo resist deposition steps, PVD for metal film deposition and a lift off process. For a heater alone, wide chromium (Cr) lines (~1500 µm) can be deposited by Cr film deposition (PVD). The pattern of the heater may be formed by selective Cr etching from the burl tops using a hard mask. A metal electrode of an electrostatic clamp may include or consist of aluminum, or chromium or any other conductive material. The metal electrode may be formed by PVD or sputtering. Alloys of these metals in any suitable combination may be used.

It is desirable to electrically isolate deposited metal lines from above and protect them from particle depositions, scratches and oxidation. Hence, as mentioned above, a top or outermost (where the layer on which the metal lines are being formed is not upwardly facing) isolation layer may be formed, for example deposited, on the patterned electrodes. For a heater or a sensor, the isolation layer can be deposited by spray coating of BCB and/or NN 120 or $SiO_x$ as described previously or a combination of sprayed layers and $SiO_x$. In the case of an electrostatic clamp, a top isolation layer also provides dielectric strength so that the clamping pressure and gap between the layer stack and substrate can be tuned to desired values. In an embodiment, the top isolation layer for an electrostatic clamp consists of spray coated polymer layers of BCB, NN 120 (or combination of these two sprayed materials) or $SiO_x$ alone or a combination of sprayed polymers layers and $SiO_x$, or parylene (CVD) alone. The top isolation layer 203 desirably has a layer thickness greater than about 0.1 µm, desirably greater than about 1 µm. The top isolation layer 203 desirably has a layer thickness less than about 10 µm, desirably less than about 3 µm, for a heater or a sensor. For an electrostatic clamp, the top isolation layer desirably has a layer thickness less than about 100 µm, desirably less than about 20 µm. In an embodiment the thickness is in a range from about 10 to about 60 µm.

Table 2 shows examples of suitable materials for each constituent layer of a thin film stack. Each layer may be formed of one of the listed materials or a combination of two or more of the listed materials.

TABLE 2

| Appl. Layer | 1. Heater only | 2. Sensor & Heater | 3. Clamp |
|---|---|---|---|
| Planarization | BCB spray<br>CAG 37 spray<br>NN 120 spray | BCB spray<br>CAG 37 spray<br>NN 120 spray | BCB spray<br>CAG 37 spray<br>NN 120 spray |
| Bottom isolation | BCB spray<br>CAG 37 spray<br>NN 120 spray<br>SiOx<br>PVD/CVD/<br>PECVD/<br>Sputtering<br>Polyimide Spray | BCB spray<br>CAG 37 spray<br>NN 120 spray<br>SiOx<br>PVD/CVD/<br>PECVD/<br>Sputtering<br>Polyimide Spray | BCB spray<br>CAG 37 spray<br>NN 120 spray<br>SiOx<br>PVD/CVD/<br>PECVD/<br>Sputtering<br>Parylene CVD<br>Polyimide Spray |
| Metal layer | Chrome<br>PVD/CVD/<br>Sputtering | Platinum<br>PVD/CVD/<br>Sputtering<br>lift-off | Chrome,<br>Aluminum<br>PVD/CVD/<br>Sputtering |
| Top isolation | BCB spray<br>CAG 37 spray<br>NN 120 spray<br>SiOx<br>PVD/CVD/<br>PECVD/<br>Sputtering<br>Polyimide Spray | BCB spray<br>CAG 37 spray<br>NN 120 spray<br>SiOx<br>PVD/CVD/<br>PECVD/<br>Sputtering<br>Polyimide Spray | BCB spray<br>CAG 37 spray<br>NN 120 spray<br>SiOx<br>PVD/CVD/<br>PECVD/<br>Sputtering<br>Parylene CVD<br>Polyimide Spray |

Table 3 shows examples of specific function and requirements per layer for the applications.

TABLE 3

| Appl. Layer | 1. Heater only | 2. Sensor & Heater | 3. Clamp |
|---|---|---|---|
| Planarization | reduce roughness | reduce roughness | reduce roughness improve flatness (pressure uniformity) |
| Bottom isolation | moderate electrical isolation low temperature difference across the layer short response time | high electrical isolation (for sensor resolution) low temperature difference across the layer short response time | high dielectric strength high volume resistivity low temperature difference across the layer |
| Metal layer | heater power | sensor sensitivity sensor stability heater power | high voltage requirements (electrode layout) |
| Top isolation | encapsulation | encapsulation | high dielectric strength high volume resistivity low temperature difference across the layer |

Thin film technology offers an overlay improvement and a cost effective solution for heater and/or sensor development. Metal pattern designs can be modified easily (by modifying mask designs). In an electrostatic clamp, the layer stack may avoid critical glass bonding steps used in the current substrate clamp manufacturing process. Because the clamp can be built up in between the burls it is possible to have SiSiC burls. This is beneficial for wear. If a platinum (Pt) metal layer is used, a titanium adherence layer can first be applied to improve adhesion of the Pt layer. For electrostatic clamps, any suitable metal having a low resistance can be used.

In an embodiment, the planarization layer and thin film stack are deposited on a flat base. Holes for burls are left or created by etching the planarization layer and thin film stack through a mask or photoresist. The burls are then grown in the holes.

Figure 21:
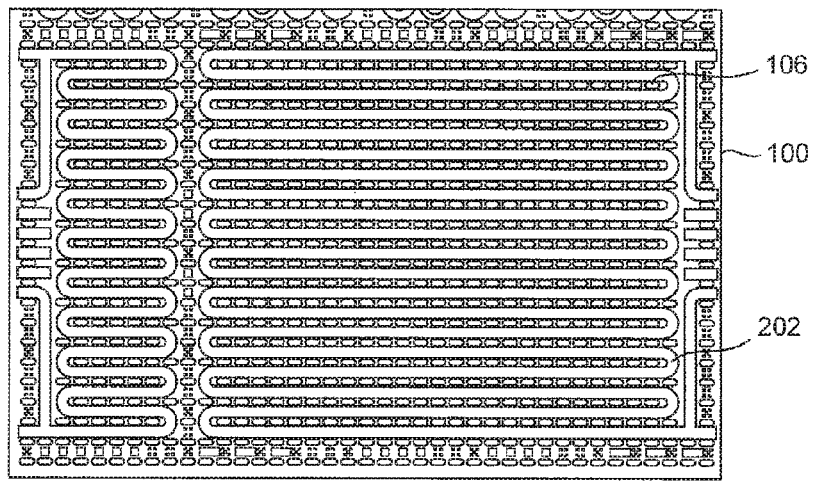
FIG. 21 depicts in plan the substrate holder of FIG. 20.
Figure 22:
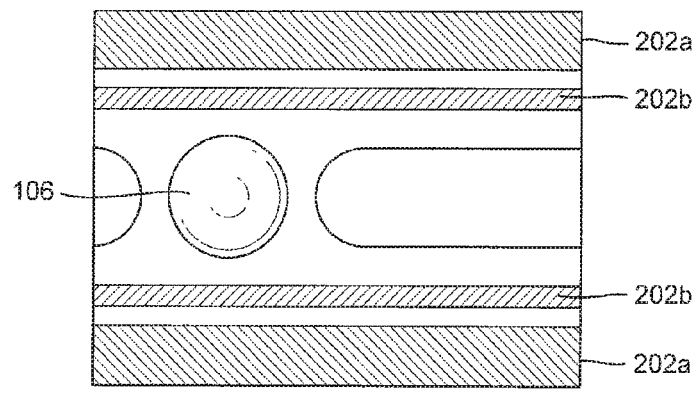
FIG. 22 is an enlarged plan view of part of the substrate holder of FIG. 20.

FIG. 21 is a plan view of the substrate holder 100 of FIG. 20. Burls 106 and patterned metal, e.g. Cr, lines can be seen. FIG. 22 is an enlarged view showing heater lines 202*a* and sensor lines 202*b*.

Dielectric layers can be deposited by spray coating, spin coating and PE CVD techniques. Spray coating is particularly suitable for depositing a polymer based layer (dissolved in organic solvent) such as a BCB and/or NN 120 layer. Such a polymer layer can be used to planarize SiSiC surface between the burls by filling up valleys. But, first sprayed layers may suffer from surface defects such as pin-holes (because of local impurities) and cracks (most likely because of stresses induced in the layers) if too thick layers are deposited. It is possible to reduce the effect of these surface imperfections by combining different deposition processes. In an embodiment of the invention, layers can be applied using an inkjet or bubble-jet printing technique. This allows for local control of the layer thickness, which can be useful to correct for local variation in the surface contour or the surface roughness of the surface on which the thin film device is to be formed, e.g. the substrate holder. One or more of these techniques enable patterning of a conductive layer using a conductive ink. A combination of different materials and/or layer formation techniques may be desirable as a defect in one layer can be cured by another layer.

Figure 23:
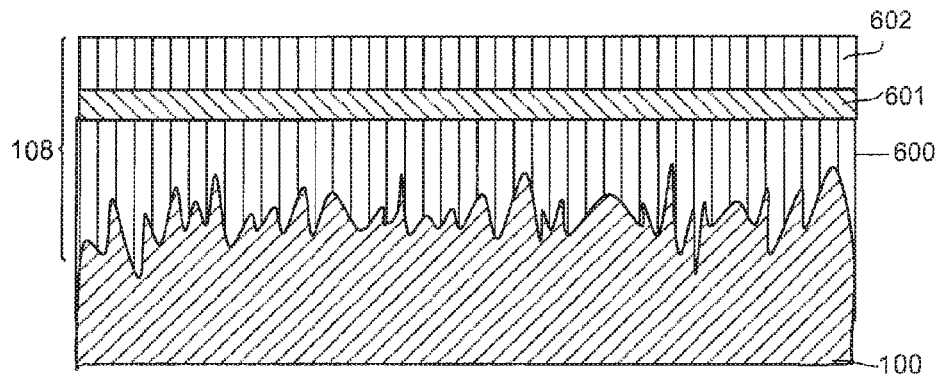
FIG. 23 depicts in cross-section a substrate holder according to an embodiment of the invention.

An embodiment of the invention is shown in FIG. 23 which is a cross-section of part of a substrate holder 100. On top of the rough surface of substrate holder 100, planarization layer 108 is formed by the following layers. First layer 600 is formed, e.g., by a spray coating method as described above. After the spray coating process, a second layer 601 can be deposited as a PE CVD $SiO_x$ layer. The second layer covers possible pinholes and particles present in the first layer. After the PE CVD $SiO_x$ layer, a third layer 602 of BCB is sprayed to fill possible pinholes in the $SiO_x$. By having two different characteristic processes the effect of pinholes and particles is reduced or minimized. The spray coating will fill in the gaps and the CVD process covers the particles. This stacking of thin layers (spraying and PE CVD) can be repeated for increased strength and robustness to pinholes and particles. In an embodiment of the invention first layer 600 is deposited by, for example, PE CVD, and the second layer 601 is formed by spray or spin coating. In an embodiment of the invention, three or more different layer types, e.g. different compositions or different methods of application, may be used in a desired order. A thin film stack (not shown) forming an electrical component is provided on top of planarization layer 108.

Figure 24:
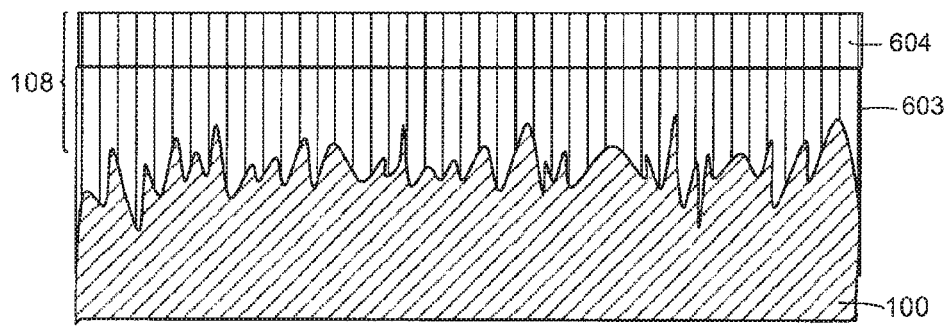
FIG. 24 depicts in cross-section a substrate holder according to an embodiment of the invention.

An embodiment of the invention is shown in FIG. 24 which is a cross-section of part of a substrate holder 100. This embodiment has a planarization layer 108 formed of two spray coated layers 603, 604 of BCB with an intermediate curing step which improves the robustness to pinholes and particles. This stack will consist of a first spray coated layer 603 to fill in the roughness and surface imperfections of the substrate (similar to the previous embodiment). The layer between the burls is cured to obtain the desired dielectric properties. Possible pinholes in the first layer are filled when a second BCB layer 604 is sprayed and cured. It is possible to repeat this process to reduce the chance of pinholes. A thin film stack (not shown) forming an electrical component is provided on top of planarization layer 108.

For process characterization, voltage breakdown tests with a 40 micron layer of BCB on Si substrate, built from two 20 μm thick BCB layers with intermediate baking step were performed. The measurement showed high voltage breakdown strength over 7 KV for such a stacked 40 μm BCB layer.

Figure 25:
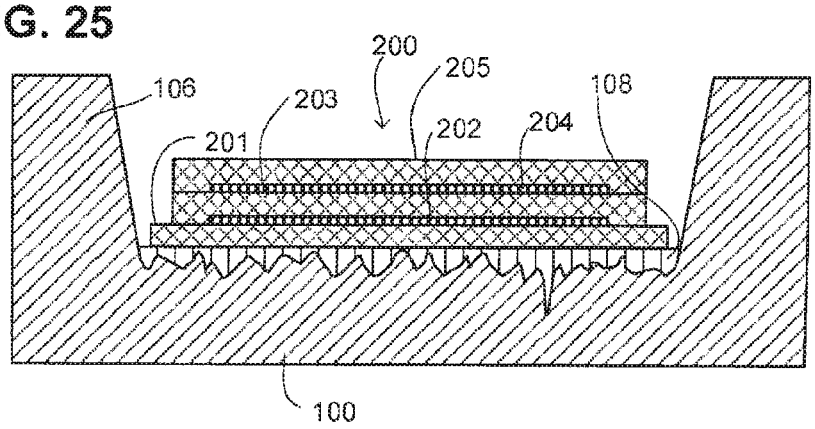
FIG. 25 depicts in cross-section a substrate holder according to an embodiment of the invention.

An embodiment of the invention is shown in FIG. 25 which is a cross-section of part of a substrate holder 100. This embodiment has a planarization layer 108 which can be formed by any of the above-described methods. Above planarization layer 108 is formed a thin film stack 200 comprising, in order above the planarization layer 108, first isolation layer 201, a first metal layer (e.g., metal lines) 202, second isolation layer 203, second metal layer (e.g., metal lines) 204 and third isolation layer 205. Each of these layers can be formed by a suitable method as described above. Further metal layers and further isolation layers can also be provided. In this embodiment, the use of two or more stacked metal layers allows the formation of two or more stacked components, e.g. sensors. Stacked sensors can provide increased isolation from noise. In an embodiment, one or more metal layers can act as shielding for one or more signal lines in other layers.

Figure 26:
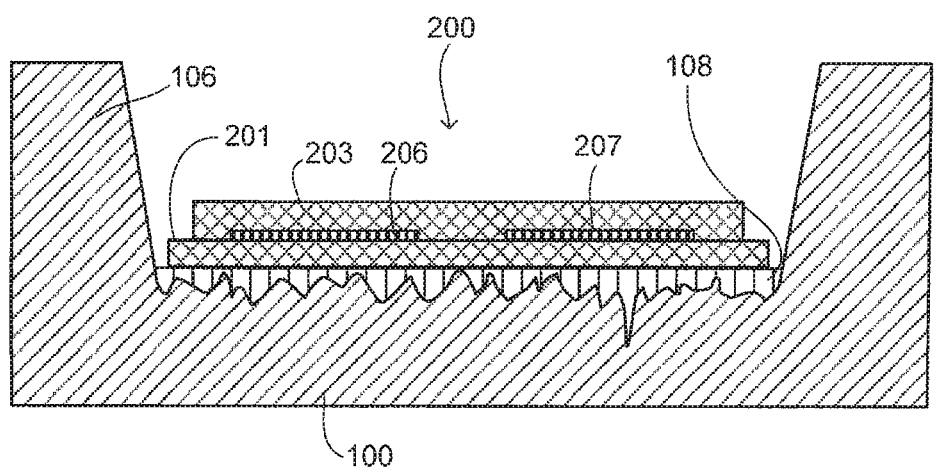
FIG. 26 depicts in cross-section a substrate holder according to an embodiment of the invention.

An embodiment of the invention is shown in FIG. 26 which is a cross-section of part of a substrate holder 100. This embodiment has a planarization layer 108 which can be formed by any of the above-described methods. Thin film stack 200 comprises first isolation layer 201 and second isolation layer 203. In between, e.g. sandwiched between the first and second isolation layers 201, 203 are electronic components 206, 207. Multiple components may be formed in a single layer on the substrate. In an embodiment, each of the components 206, 207 is formed by a plurality of layers, for example by reference to the material used for each layer: metal, amorphous silicon, metal. In an embodiment, one or more of the components 206, 207 forms a transistor or other logic device. Such logic devices can be used to control an array of heaters disposed across the surface of the substrate holder without requiring individual connections to each heater. The transistors can be arranged at the intersection of word and bit lines and each connected to an associated heater to form an active matrix.

Figure 27A:
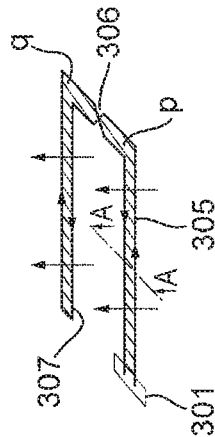
FIGS. 27A to E depict arrangements of sensors usable in an embodiment of the invention.

FIGS. 27A to E illustrate schematically sensors according to an embodiment of the invention. In its simplest form, a temperature sensor 300 comprises a conductive loop disposed on the substrate holder. This is shown in FIG. 27A where the conductive loop 302 is shown connected to a connector 301. Conductive loop 302 may be formed of a material having a positive temperature co-efficient of resistivity, e.g. platinum, or a material having a negative temperature co-efficient of resistivity. As the temperature of the substrate holder varies, so does the resistance of the conductor 302. This can be measured, e.g. using a Wheatstone bridge, and thereby the temperature of the substrate holder in the locality of the sensor 300 can be determined.

In the arrangement shown in FIG. 27A, the conductive loop 302 encompasses a significant area indicated by shading. The conductive loop 302 will therefore pick up interference which will create noise in the measurement signal and may obscure the temperature measurement. In a practical embodiment, the environment of the substrate holder is likely to be electromagnetically noisy due to the presence of a powerful electromagnetic motor used to position the substrate table. The electromagnetic field can have a frequency <10 kHz which is difficult to shield. It is desirable to detect very small temperature changes, e.g. about 50 μK, which involves detection of small signals. Therefore one or more measures to limit noise pickup and/or filter it out are desirable.

Figure 27B:
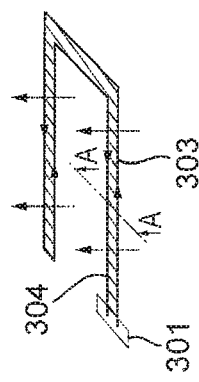

In an embodiment, depicted in FIG. 27B, the conductor is arranged in a double U-shape with an outer conductor 303 and an inner conductor 304 separated by a small distance. Desirably, the distance between the outer conductor 303 and inner conductor 304 is at no point greater than or equal to 500 μm, desirably less than or equal to 200 μm, or desirably less than or equal to 100 μm. Both the inner and outer conductors 304, 303 lie in substantially the same plane and are connected at one end to form a continuous conductive path. Compared to the embodiment of FIG. 27A, the conductor of FIG. 27B encloses less area, indicated in FIG. 27B by shading, and therefore picks up less electromagnetic noise.

Figure 27C:
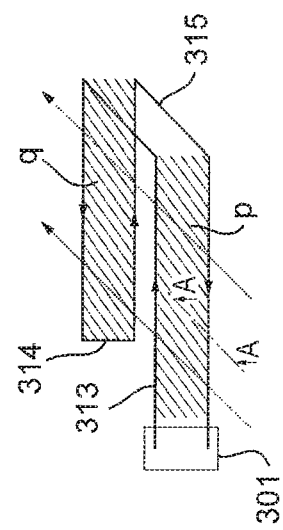

A "twist" or cross-over 306 may be provided to the sensor of FIG. 27B as shown in FIG. 27C. At cross-over 306, the outward and return conductors of the sensor 300 pass over one another but do not make electrical contact. The sensor is therefore divided into two segments 305, 307, which are in effect wound in opposite senses. Therefore, a given changing field induces opposite currents in the two segments. If the fields in the areas p, q, indicated in the Figure by shading, enclosed by the two segments undergo the same changes, the induced noise will be cancelled out. If the interference field is significantly non-uniform, multiple cross-overs 306 can be provided to improve noise cancellation. Desirably, the number of cross-overs is odd so that there are an even number of segments, half wound in each sense. Desirably, the total area enclosed by conductive segments of one sense is substantially equal to the area enclosed by conductive segments of the other sense. Desirably, adjacent conductive segments enclose substantially equal areas.

Figure 27D:
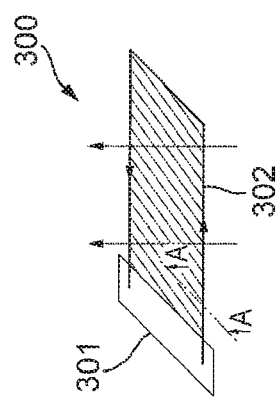
Figure 27E:
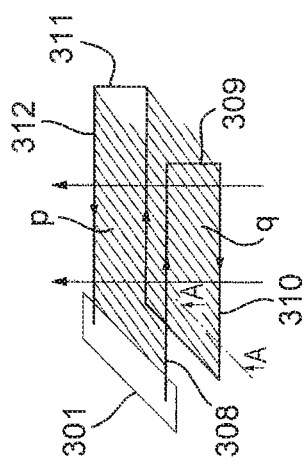

A reduction in noise can be achieved using a sensor comprising conductors disposed in two substantially parallel layers on the substrate holder. Examples are shown in FIGS. 27D and 27E. In the embodiment of FIG. 27D, the sensor 300 comprises a first conductor 308 leading away from connector 301 and disposed in a first layer substantially parallel to the surface of the substrate holder. This is connected to a vertical conductor or via 309 which connects to a second conductor 310 forming a U-shape and disposed in a second layer substantially parallel to the plane of the substrate holder. A first upright of the second, U-shaped, conductor 310 is disposed substantially parallel to and overlapping the first conductor 308. A second vertical conductor or via 311 connects the other end of U-shaped conductor 310 to a third conductor 312 disposed in the substantially same layer as the first conductor 308. Third conductor 312 completes the conductive path back to connector 301. The arrangement of FIG. 27D is effective in cancelling out interference from fields that are substantially perpendicular to the plane of the substrate holder. Desirably, the area q, indicated in FIG. 27D by shading, within the second, U-shaped, conductor 310 is substantially equal to the area p, indicated in FIG. 27D by shading, between the first and third conductors 308, 312.

A further arrangement that is effective where the interfering field is substantially parallel to the plane of the substrate holder is depicted in FIG. 27E. In this embodiment, the sensor 300 comprises two substantially overlapping U-shaped conductors 313, 315 disposed in vertically spaced-apart layers on the substrate holder. One end of each conductor is connected to connector 301, the other ends are joined by a vertical conductor or via 314. Noise currents caused by field changes in area p will be at least partly cancelled by noise currents caused by field changes in area q.

Figure 28A:
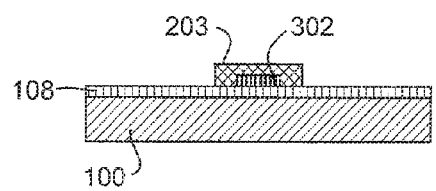
FIGS. 28A to H depict in cross-section arrangements of sensors usable in an embodiment of the invention.
Figure 28B:
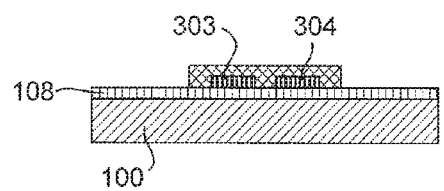

Cross-sections of the sensors described above in a plane perpendicular to the plane of the substrate holder are shown in FIGS. 28A to 28D. The positions of the cross-sections are indicated by lines A-A. FIG. 28A shows a cross-section through one arm of conductor 302 of the sensor of FIG. 27A. It will be seen that conductor 302 is disposed on a planarization layer 108 above substrate holder main body 100 and is covered with an isolation layer 203. FIG. 28B is a cross-section through conductors 303, 304 of the sensor of FIG. 27B showing that these conductors are disposed side by side in a single layer on the substrate holder. A cross-section through one arm of the sensor of FIG. 27C is similar.

Figure 28C:
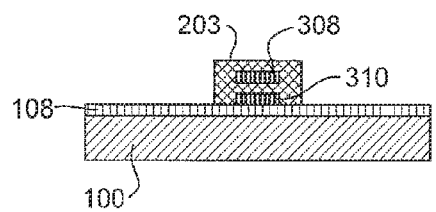
Figure 28D:
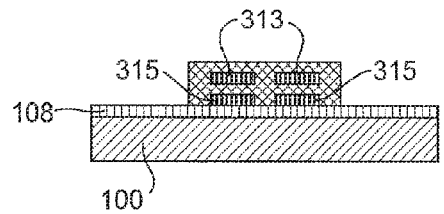
Figure 28E:
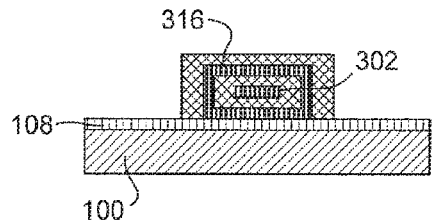
Figure 28F:
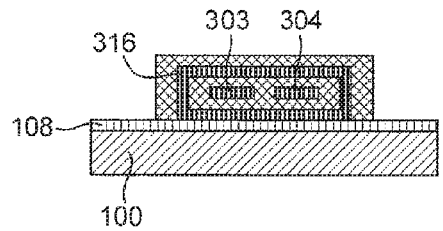
Figure 28G:
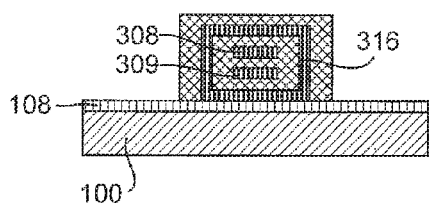
Figure 28H:
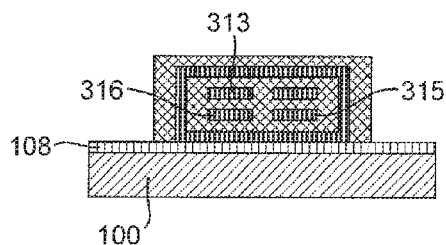

The cross-section through the two-layer sensor structure of FIG. 27D is shown in FIG. 28C. The cross-section through the two-layer sensor structure of FIG. 27E of both arms are shown in FIG. 28D. There it can be seen that the conductors of the two layers are disposed in an overlapping arrangement, encapsulated in and separated by isolation layer 203.

FIGS. 28E to 28H show sensors including a shielding layer 316 to provide further isolation from electromagnetically induced noise currents. The shield 316 can be applied to any of the forms of sensor described above, as illustrated in FIGS. 28E to 28H. Shield 316 acts in the manner of a Faraday cage to reduce or eliminate electromagnetic fields within it. The effect is equivalent to that of the shielding in a coaxial cable. Desirably, the shield 316 completely surrounds substantially all of the sensor 300. In an embodiment, shield 316 is connected to ground, e.g. via connector 301. In an embodiment, shield 316 is employed as an electric heater to locally control the temperature of the substrate holder by passing current through it.

Figure 29:
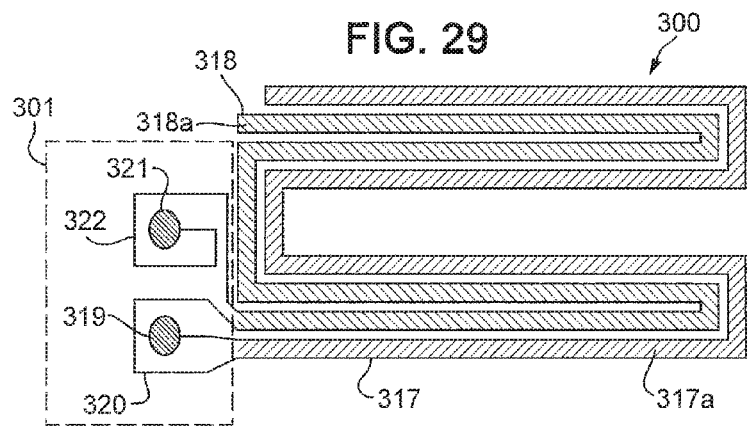
FIG. 29 depicts in plan a sensor usable in an embodiment of the invention.

A further sensor usable in an embodiment of the invention is shown in FIG. 29. This comprises two sensor segments 317, 318, each of which comprises a single conductor that departs from connector 301, follows a convoluted path including multiple turns or switchbacks and then returns to connector 301 via a substantially parallel but slightly offset path. The two conductors are close together in a single layer on the substrate holder but do not cross. It will be seen that conductor 317 encloses an area 317a, indicated in FIG. 29 by right-leaning hatching, that has a complex, winding shape with multiple turns and reversals. The second conductor 318 similarly encloses an area 318a, indicated in FIG. 29 by left-leaning hatching, that adopts a similarly complex or convoluted form largely located within turns of the first conductor 317.

Within connector 301 one end of each of the conductors 317, 318 is connected to a respective contact pad 319, 321. A further conductor 320 loops around the contact pad 319 to connect together the other ends of conductors 319, 318. An additional loop conductor 322 is used to effect the connection between contact pad 321 and conductor 318. The arrangement of loop conductors 320 and 322 is such as to reduce or minimize induced noise within the connector and help ensure that conductors 317, 318 are connected in opposite senses. This means that a given field change will induce opposite currents in conductors 317 and 318. Since the areas 317a, 318a are substantially equal, close together and intertwined, noise currents induced in conductor 317, 318 will very nearly exactly cancel out.

Figure 30:
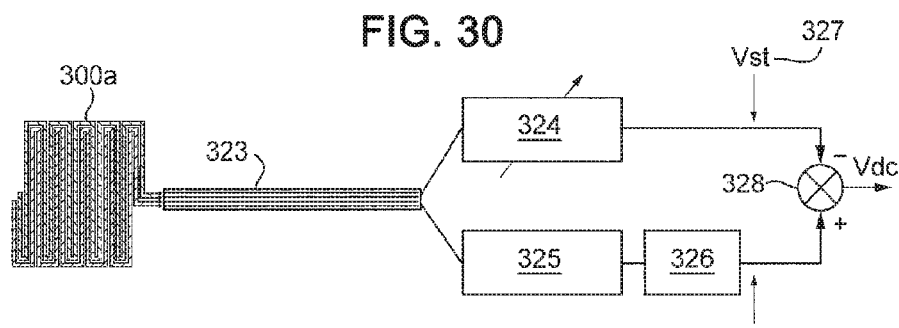
FIG. 30 depicts a sensing circuit usable in an embodiment of the invention.
Figure 31:
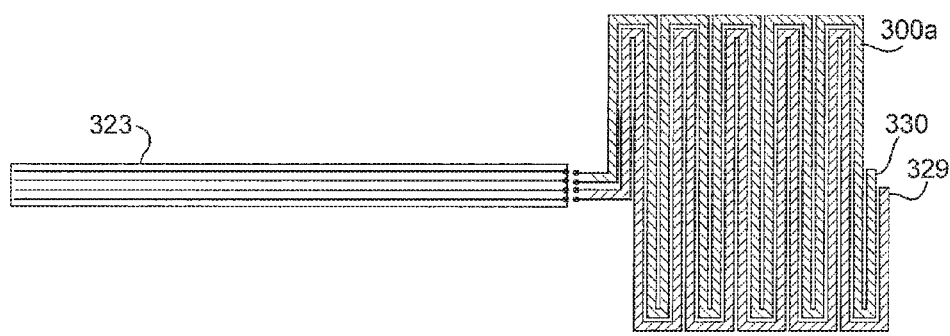
FIG. 31 is an enlarged view of the sensor and connector of the circuit of FIG. 30.

FIG. 30 depicts a sensor system usable in an embodiment of the invention. A sensor 300a formed by a convoluted conductive track is formed on the substrate holder. It is connected to sensor circuitry by a flat flexible interconnect 323. Sensor 300a has two electrodes 330, 329 which have convoluted forms and are interleaved, as shown in FIG. 31. One of the electrodes 329 is connected to Wheatstone bridge 325 which is arranged to measure its resistance. The output signal is amplified by amplifier 326 and supplied to positive input of adder 328. The other electrode 330 is connected to variable amplifier 324 which outputs a signal having an amplitude matching that of the output of amplifier 326. The output of amplifier 324 is connected to a negative input of adder 328. In effect, electrode 330 picks up only a noise signal which is then subtracted from the signal generated from electrode 329 to leave a signal indicating only a temperature change.

Flexible connector 323 is illustrated as a flat cable with a straight conductor for each terminal of the sensor 300a. However, multiple tracks, shielding and/or twists can be applied to the flexible connector 323 to reduce or minimize pickup of electromagnetic noise. Depending upon the application, the length of the flexible connector 323 can be between 50 and 1500 mm. The flexible connector 323 is, in an embodiment, formed by printing conductive tracks on a flexible substrate.

Figure 32:
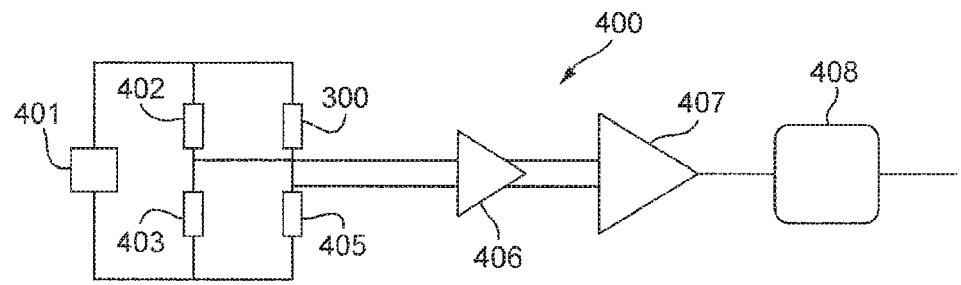
FIG. 32 depicts a measurement circuit usable in an embodiment of the invention.

FIG. 32 illustrates a measurement circuit 400 used in an embodiment of the invention. A DC or AC voltage source 401 applies a voltage across a Wheatstone bridge formed of sensor resistor 300 and reference resistors 402, 403, 405. The signal across the middle of the bridge is amplified by amplifier 406, e.g. with a gain of about 100, and digitized by an analog to digital converter 407. The output of ADC 407 is supplied to interface 408 which communicates with the overall control system of the apparatus 500.

Figure 33:
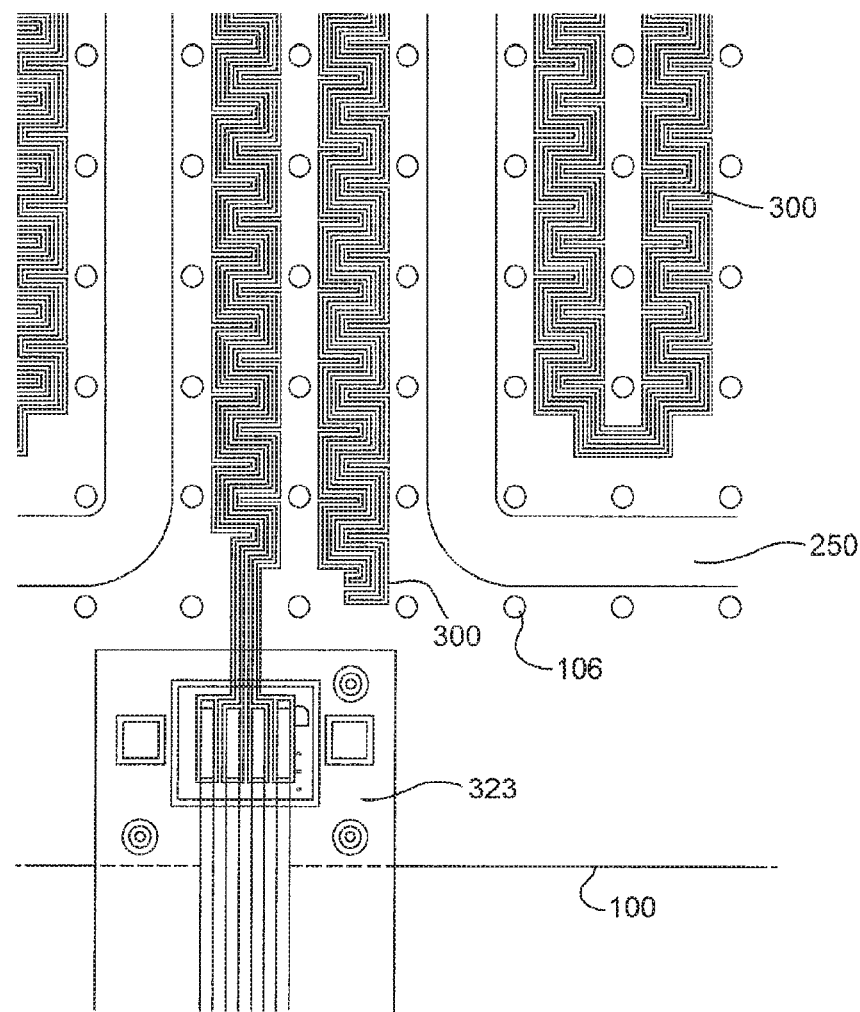
FIG. 33 depicts an arrangement of sensors and heaters usable in an embodiment of the invention.

A more detailed arrangement of an embodiment of the invention is illustrated in FIG. 33. On one surface of substrate 100, in between burls 106, a resistive heating element 250 is provided. The heating element 250 is divided into segments which are individually controllable in order to locally control the temperature of the substrate holder and a substrate held thereon. The heating element 250 has a meandering path, only part of which is shown in FIG. 33. Temperature sensor 300, which comprises two interleaved conductive loops as described above, is disposed within turns of the heating element 250.

Figure 34:
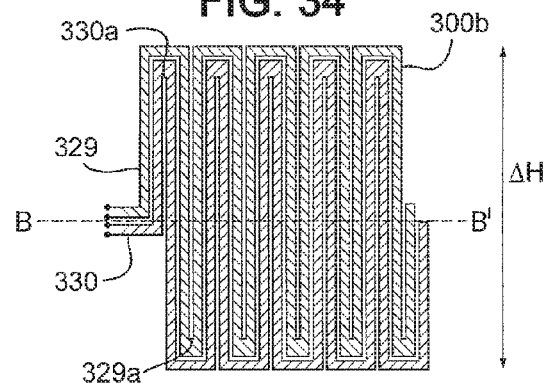
FIG. 34 depicts in plan a sensor usable in an embodiment of the invention.

The sensor structure 300 can be fine tuned to reduce or minimize pickup of electromagnetic noise. This is illustrated in FIG. 34 which shows a sensor 300b intended to be used in a situation where the gradient of the magnetic field lies in the direction indicated by the arrow ΔH. In sensor 300b, the positions of the innermost turns 329a and 330a of conductors 329, 330 are adjusted to help ensure that the center of area of the areas enclosed by each conductor lies in a desired position, e.g. on the line B-B'.

Figure 35:
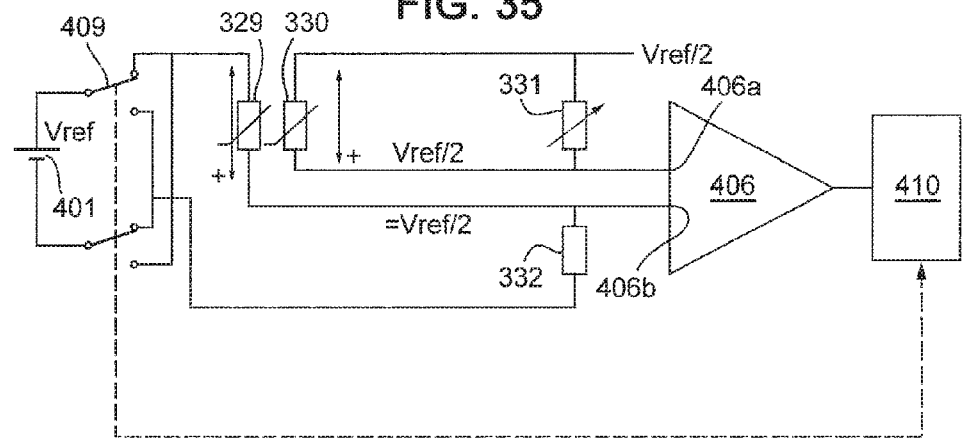
FIG. 35 depicts a measurement circuit usable in an embodiment of the invention.

A measurement circuit usable in an embodiment of the invention is shown in FIG. 35. A DC reference voltage source 401 is applied across a series combination of one sensor conductor 329 and a reference resistor 332 of the same nominal resistance via switches 409 which alternately apply the reference voltage with alternative polarity by control 410. Half the reference voltage is applied across a parallel combination of the other sensor conductor 330 and an adjustable resistor 331 used to adjust the circuit. High impedance inputs 406a, 406b of operational or instrument amplifier 406 are connected to one end of respective conductors 329, 330. The output of operational amplifier 406 is then provided to a synchronic detector of known form which reduces or eliminates noise. The synchronic detector can be implemented in hardware or software. An analog to digital converter can also be provided to generate a digital signal for the controller 500.

Figure 36:
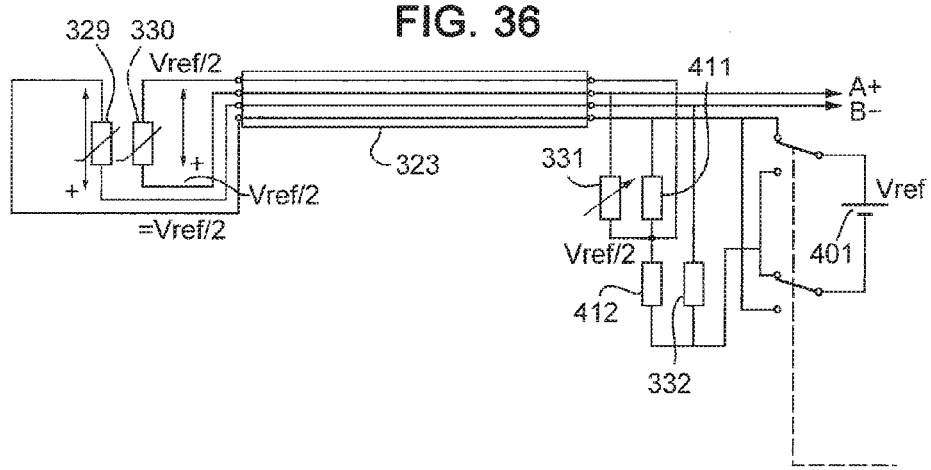
FIG. 36 depicts a measurement circuit usable in an embodiment of the present invention.

FIG. 36 shows in more detail an implementation of the circuit of FIG. 35 using a flexible connector 323 to connect remote circuitry to sensor conductors 329, 330 provided on the substrate holder. Aside from the introduction of flexible connector 323, the circuit of FIG. 36 is topologically equivalent to that of FIG. 35. Vref/2 is provided by voltage divider formed by resistors 411, 412.

Figure 37:
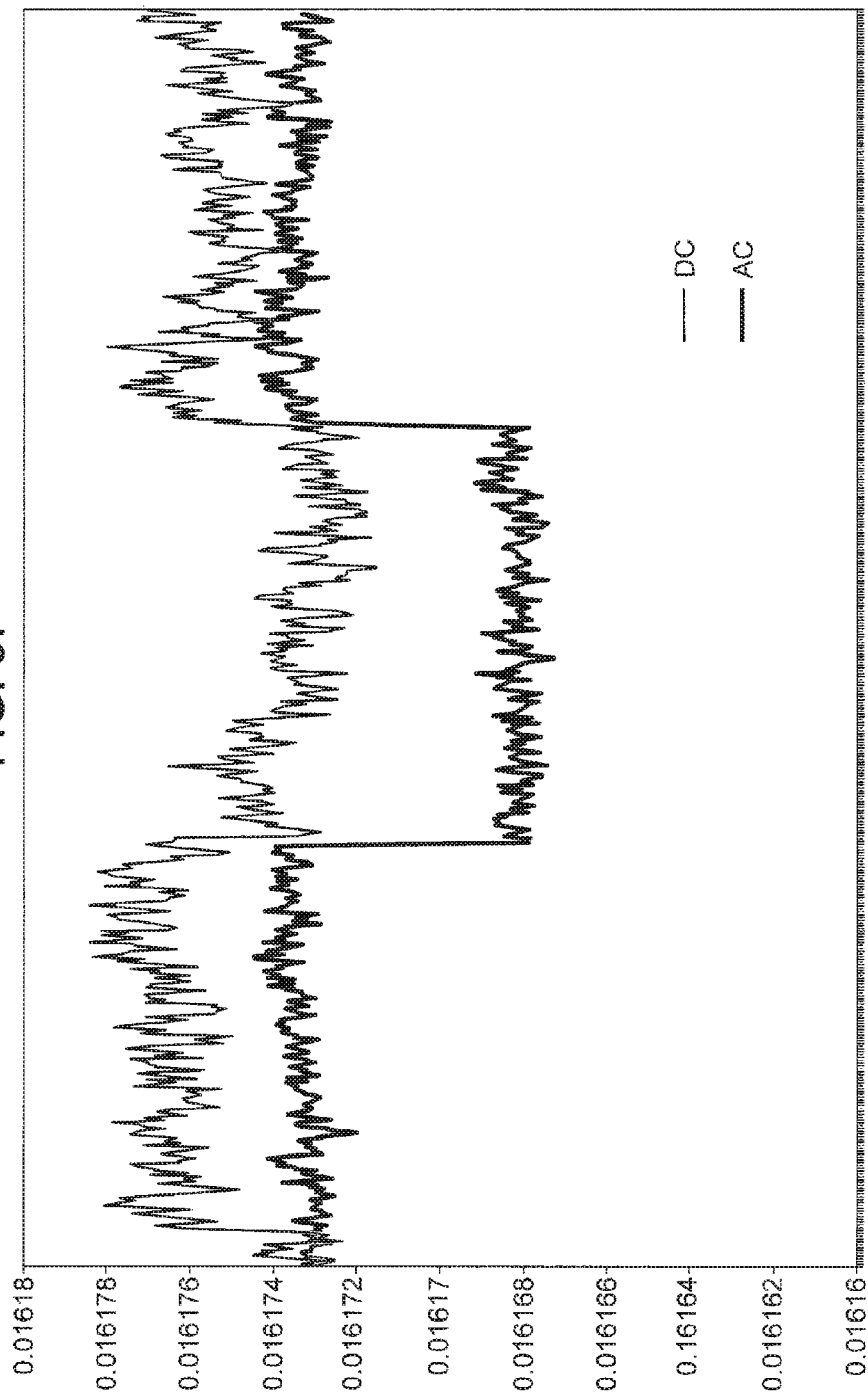
FIG. 37 depicts simulated signals obtained in an embodiment of the invention.

Output signals of a test structure are shown in FIG. 37 in which the X axis represents time in arbitrary units and the Y axis represents signal output in arbitrary units. The relatively high noise levels present can easily be seen. In the middle portion of the graph, a small voltage change is applied to simulate the effect of a 1 milli-kelvin temperature change of the sensor. This change is more readily detectable in the lower (thick) line representing results from an arrangement using alternating voltage and synchronic detection compared to the upper (thin) line using a constant DC voltage and no synchronic detection. An analog low-pass filter can be added to further reduce noise levels.

FIGS. 38A and 38B illustrate two forms of flexible connector usable in an embodiment of the invention. In flexible connector 323 shown in FIG. 38A, each conductive path is formed as a single continuous area of conductive material 323a, 323b disposed on the flexible substrate 323c. In FIG. 38B, each conductive path is divided into a number of separate strips 323d which are interleaved and connected together at the ends. FIGS. 39A and 39B illustrate the effective areas for pickup of electromagnetic radiation of the conductors shown in FIGS. 38A and 38B respectively. It will be seen that the multiple track, interleaved connector of FIG. 38B presents an effectively smaller area and therefore picks-up less electromagnetic noise.

Figure 40:
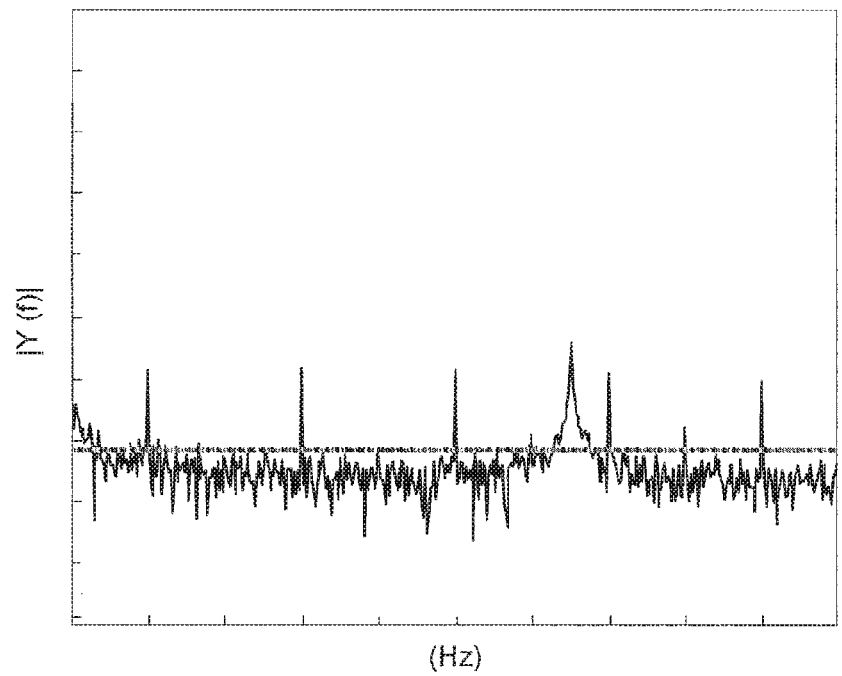
FIGS. 40 and 41 depict noise in sensors connected in phase and out of phase respectively.
Figure 41:
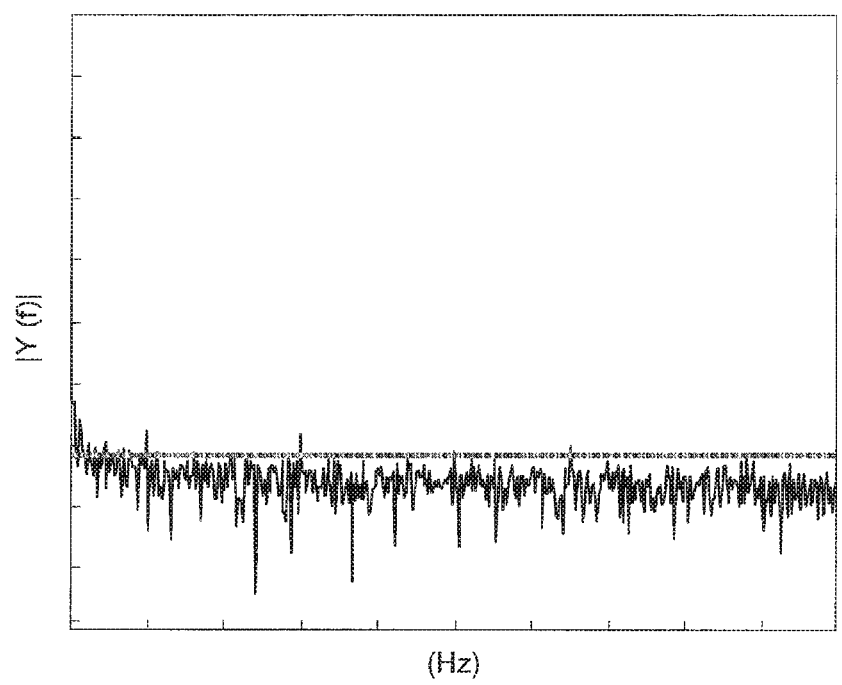

FIGS. 40 and 41 illustrate frequency spectra for noise currents induced in two different sensor arrangements usable in an embodiment of the invention. In FIG. 40 two sensor structures are connected in phase as in FIG. 43 whereas in FIG. 41 two sensor structures are connected in opposite phase as in FIG. 42. It will be seen that the noise spectrum in FIG. 40 has at a fundamental frequency and its harmonics derived peaks from local electricity supply as well as a peak at a specific frequency deliberately applied for experimental purposes using a coil. In FIG. 41 it can be seen that both the local electricity supply-induced noise currents and the deliberately induced noise are effectively suppressed.

In an embodiment of the invention, the sensor circuit can be arranged for increased or maximum suppression of electromagnetic interference or for optimization of gain. Suitable circuits are shown respectively in FIGS. 42 and 43. In both of these Figures, voltage source 401 provides an alternating voltage to compensate for Seebeck effects, 1/f noise and drift. In both circuits of FIGS. 42 and 43 an amplifier, analog to digital converter and other interface circuitry is connected to the open terminals shown.

Figure 42:
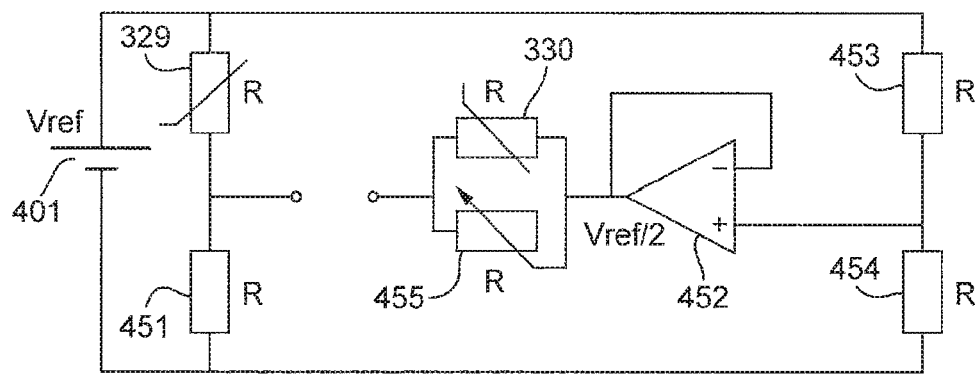
FIG. 42 depicts a measurement circuit usable in an embodiment of the invention.

In FIG. 42 voltage divider formed by equal resistances 453, 454 and operational amplifier 452 provide a reference voltage at half the output of voltage source 401. Variable resistor 455 is used to adjust the level of the noise signal provided by sensor conductor 330 which thereby provides a noise reference signal. First sensor conductor 329 and reference resistor 451 are connected in series across voltage source 401. Thereby the output signal taken between the voltage at the junction of first sensor 329 and reference resistor 451 and the floating reference voltage provides a noise reduced signal. Electromagnetic noise induces the same change at both output terminals and therefore cancels.

Figure 43:
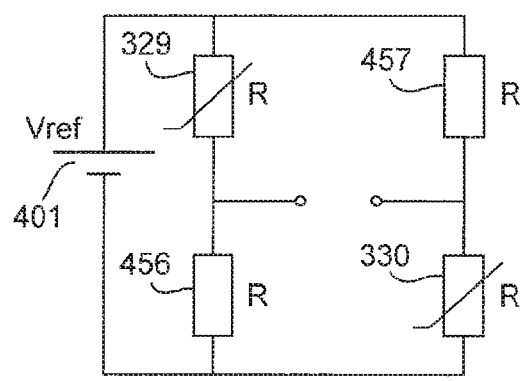
FIG. 43 depicts a measurement circuit usable in an embodiment of the invention.

In FIG. 43, the first and second sensor conductors 329, 330 are positioned diagonally opposite each other in a Wheatstone bridge arrangement with reference resistors 456, 457. The output signal provided across the middle of the bridge thereby has double gain but similarly a noise induced voltage is doubled.

In the above described embodiments, the sensor conductors are laid out with substantially right-angled corners. In an embodiment, acute and obtuse angle corners can be used. The conductors can be laid out with curved arrangements. In the embodiments described above, signals from the two sensors are combined in the analog domain to reduce or minimize electromagnetic interference. It is possible to separately digitize signals from two sensor electrodes and remove the electromagnetic interference in software.

In an embodiment, there is provided a substrate holder for use in a lithographic apparatus, the substrate holder comprising: a main body having a surface; a plurality of burls projecting from the surface and having end surfaces to support a substrate; a planarization layer provided on at least part of the main body surface; and a thin film stack provided on the planarization layer and forming an electric component.

In an embodiment, the thin film stack includes a conductive layer. In an embodiment, the conductive layer is formed of a metal, such as a metal selected from the group consisting of: Cr, Al, Pt and alloys thereof. In an embodiment, the conductive layer has a thickness in the range of from about 20 nm to about 1 µm. In an embodiment, the thin film stack includes an isolation layer provided on the surface of the conductive layer furthest from the planarization layer. In an embodiment, the thin film stack includes an isolation layer between the conductive layer and the planarization layer. In an embodiment, the or an isolation layer is formed of a material or a combination of materials selected from the group consisting of: benzocyclobutene; perhydropolysilazane, $SiO_x$, parylene and polyimide. In an embodiment, the or an isolation layer has a thickness in the range of from about 0.1 µm to about 100 µm. In an embodiment, the or an isolation layer has a thickness in the range of from about 0.1 µm to about 10 µm, desirably from about 1 µm to about 3 µm. In an embodiment, the or an isolation layer has a thickness in the range of from about 20 µm to about 100 µm, desirably from about 40 µm to about 60 µm. In an embodiment, the thin film stack forms a plurality of electric components. In an embodiment, a first electric component and a second electric component of the plurality of electric components are arranged in a single layer of the thin film stack. In an embodiment, a first electric component and a second electric component of the plurality of electric components are arranged in two separate layers of the thin film stack. In an embodiment, the electronic component is a component selected from the group consisting of: an electrode, a heater, a sensor, a transistor and a logic device. In an embodiment, the electrode is, in use, an electrode of an electrostatic clamp. In an embodiment, the sensor comprises a conductor arranged to reduce or minimize pickup of electromagnetic interference. In an embodiment, the conductor comprises a conductive loop formed by two substantially parallel branches, wherein the two branches have a maximum separation less than or equal to about 500 µm, less than or equal to about 200 µm, or less than or equal to about 100 µm. In an embodiment, the conductor includes a crossover. In an embodiment, the sensor comprises conductors provided in two substantially parallel layers on the substrate holder, the conductors being wound in opposite senses over at least two substantially overlapping areas. In an embodiment, the sensor includes two electrodes connected out of phase. In an embodiment, the two electrodes are disposed in convoluted and interleaved paths on the substrate holder.

In an embodiment, there is provided a lithographic apparatus, comprising: a support structure configured to support a patterning device; a projection system arranged to project a beam patterned by the patterning device onto a substrate; and a substrate holder arranged to hold the substrate, the substrate holder as described herein. In an embodiment, the lithographic apparatus further comprises a substrate table and wherein the substrate holder is integrated into the substrate table.

In an embodiment, there is provided a device manufacturing method using a lithographic apparatus, the method comprising: projecting a beam patterned by a patterning device onto a substrate while holding the substrate in a substrate holder, wherein the substrate holder comprises: a main body having a surface; a plurality of burls projecting from the surface and having end surfaces to support a substrate; a planarization layer provided on at least part of the main body surface; and a thin film stack provided on the planarization layer and forming an electric component.

In an embodiment, there is provided a substrate holder for use in a lithographic apparatus, the substrate holder comprising: a main body having a surface; a plurality of burls projecting from the surface and having end surfaces to support a substrate; and a planarization layer provided on at least part of the main body surface, the planarization layer comprises a first sub-layer and a second sub-layer, the second sub-layer having a different composition than the first sub-layer.

In an embodiment, the planarization layer further comprises a third sub-layer. In an embodiment, the first sub-layer is formed of benzocyclobutene. In an embodiment, the second sub-layer is formed of $SiO_x$.

In an embodiment, there is provided a method of manufacturing a substrate holder for use in a lithographic apparatus, the method comprising: providing a main body having a surface and a plurality of burls projecting from the surface and having end surfaces to support a substrate; and forming a planarization layer on at least part of the main body surface, wherein forming the planarization layer comprises forming a first sub-layer and a second sub-layer on the first sub-layer, the second sub-layer having a different composition than the first sub-layer.

In an embodiment, forming the planarization layer further comprises forming a third sub-layer on the second sub-layer. In an embodiment, forming the first sub-layer, or forming the second sub-layer, or forming the first and second sub-layers comprises spraying a solution of a polymer or polymer-precursor. In an embodiment, forming the first sub-layer, or forming the second sub-layer, or forming the first and second sub-layers comprises a chemical vapor deposition (CVD) process, desirably a plasma-enhanced chemical vapor deposition (PE CVD) process.

In an embodiment, there is provided a method of manufacturing a substrate holder for use in a lithographic apparatus, the method comprising: providing a main body having a surface and a plurality of burls projecting from the surface and having end surfaces to support a substrate; and forming a planarization layer on at least part of the main body surface, wherein forming planarization layer comprises forming a first sub-layer, baking the first sub-layer to cure it, and forming a second sub-layer on the first sub-layer.

In an embodiment, forming the first sub-layer comprises spraying a solution of a polymer or a polymer-precursor. In an embodiment, forming the second sub-layer comprises spraying a solution of a polymer or a polymer-precursor.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation and extreme ultraviolet (EUV) radiation (e.g. having a wavelength of or about 365, 248, 193, 157, 126, 13.5 or 6.5 nm).

The term "lens", where the context allows, may refer to any one or combination of various types of optical components, including refractive and reflective optical components.

While specific embodiments of the invention have been described above, it will be appreciated that the invention, at least in the form a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or multiple processors are configured to communicate with at least one of the controllers. For example, each controller may include one or more processors for executing the computer programs that include machine-readable instructions for the methods of operating an apparatus described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm, 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A method of manufacturing a substrate holder, the method comprising:
   providing a planarization layer on at least part of a surface of a body of the substrate holder; and
   forming or attaching a thin film stack on top of the planarization layer, wherein the thin film stack forms an electric or electronic component, wherein a plurality of burls project from the surface and have end surfaces to support a substrate, and wherein the thin film stack is horizontally spaced by a gap from an adjacent burl of the plurality of burls.

2. The method of claim 1, wherein the thin film stack includes a conductive layer.

3. The method of claim 2, wherein the conductive layer has a thickness in the range of from about 20 nm to about 1 μm.

4. The method of claim 2, wherein the thin film stack includes an isolation layer provided on the surface of the conductive layer furthest from the planarization layer.

5. The method of claim 4, wherein the isolation layer is formed of one or more selected from: benzocyclobutene; perhydropolysilazane, $SiO_x$, parylene and/or polyimide.

6. The method of claim 4, wherein the isolation layer has a thickness in the range of from about 0.1 μm to about 100 μm.

7. The method of claim 2, wherein the thin film stack includes an isolation layer between the conductive layer and the planarization layer.

8. The method of claim 1, wherein the thin film stack forms a plurality of electric or electronic components.

9. The method of claim 8, wherein a first electric or electronic component and a second electric or electronic component of the plurality of electric or electronic components are arranged in a single layer of the thin film stack.

10. The method of claim 8, wherein a first electric or electronic component and a second electric or electronic component of the plurality of electric or electronic components are arranged in two separate layers of the thin film stack.

11. The method of claim 1, wherein the electric or electronic component comprises a heater and/or a temperature sensor.

12. The method of claim 1, comprising providing the planarization layer on at least part of the surface of the body to cover an area encompassing the plurality of burls, the planarization layer provided between the burls but not covering the end surfaces of the plurality of burls.

13. The method of claim 1, wherein the electric or electronic component comprises an electrically insulating layer, a metal electrode layer on top of the electrically insulating layer, and a dielectric layer on top of the metal electrode layer.

14. A method of manufacturing a substrate holder, the method comprising:

applying a first sub-layer of a planarization layer on at least part of a surface of a body of the substrate holder using a first technique, the first technique being selected from: spraying, spin coating, sputtering, physical vapor deposition or chemical vapor deposition;

applying a second sub-layer of the planarization layer on the first sub-layer using a second technique, wherein the second technique is selected from: spraying, spin coating, sputtering, physical vapor deposition or chemical vapor deposition, the second technique is different from the first technique, and the planarization layer is between a plurality of burls projecting from the surface and having end surfaces to support a substrate.

15. The method of claim 14, wherein the first technique is spraying or spin coating and the second technique is sputtering, physical vapor deposition or chemical vapor deposition.

16. The method of claim 14, wherein the first technique is sputtering, physical vapor deposition or chemical vapor deposition and the second technique is spraying or spin coating.

17. The method of claim 14, further comprising forming or attaching a thin film stack on top of the planarization layer, wherein the thin film stack forms an electric or electronic component.

18. A method of manufacturing a substrate holder, the method comprising:

applying a planarization layer on at least part of a surface of a body of the substrate holder; and forming or attaching an electric or electronic component on top of the planarization layer, wherein a plurality of burls project from the surface and have end surfaces to support a substrate and wherein the electric or electronic component is horizontally spaced by an open gap from a side wall of an adjacent burl of the plurality of burls.

19. The method of claim 18, wherein the electric or electronic component comprises an electrically insulating layer and a metal electrode layer on top of the electrically insulating layer.

20. The method of claim 18, comprising applying the planarization layer on at least part of the surface of the body to cover an area encompassing the plurality of burls, the planarization layer provided between the burls but not covering the end surfaces of the plurality of burls.

* * * * *